US012754250B2

(12) United States Patent
Yu et al.

(10) Patent No.: US 12,754,250 B2
(45) Date of Patent: Oct. 6, 2026

(54) DEVICE AND METHOD FOR SENSING STATE OF BATTERY CELL

(71) Applicant: SK ON CO., LTD., Seoul (KR)

(72) Inventors: Jeong Hyeon Yu, Daejeon (KR); Da Young Lee, Daejeon (KR)

(73) Assignee: SK On Co., Ltd., Seoul (KR)

( * ) Notice: Subject to any disclaimer, the term of this patent is extended or adjusted under 35 U.S.C. 154(b) by 509 days.

(21) Appl. No.: 18/234,275

(22) Filed: Aug. 15, 2023

(65) Prior Publication Data

US 2024/0061049 A1 Feb. 22, 2024

(30) Foreign Application Priority Data

Aug. 18, 2022 (KR) ........................ 10-2022-0103510

(51) Int. Cl.

| | |
|---|---|
| ***G01R 31/392*** | (2019.01) |
| ***G01B 11/02*** | (2006.01) |
| ***H01M 10/48*** | (2006.01) |

(52) U.S. Cl.

CPC ............ *G01R 31/392* (2019.01); *G01B 11/02* (2013.01); *H01M 10/48* (2013.01)

(58) Field of Classification Search

CPC .. G01R 31/392; G01B 11/02; G01B 11/0608; H01M 10/48; H01M 10/42; H01M 10/4285; H01M 50/531; Y02E 60/10; G01N 21/8851; G01N 2021/8887

See application file for complete search history.

(56) References Cited

U.S. PATENT DOCUMENTS

2016/0204462 A1* 7/2016 Kim .................... H01M 50/256
324/426

FOREIGN PATENT DOCUMENTS

| | | | | |
|---|---|---|---|---|
| CN | 107097009 B * | 3/2019 | ............. B23K 31/00 |
| JP | 3770484 B2 | 4/2006 | |
| KR | 101963741 B1 | 3/2019 | |
| KR | 1020220021723 A | 2/2022 | |

OTHER PUBLICATIONS

English machine translation of Li et al. (CN-107097009-B) (Year: 2019).*

* cited by examiner

*Primary Examiner* — Walter L Lindsay, Jr.
*Assistant Examiner* — Geoffrey T Evans
(74) *Attorney, Agent, or Firm* — The Webb Law Firm

(57) ABSTRACT

A device and method of sensing a state of a battery cell disposed on a mounting unit are disclosed. The method includes an image acquisition step of acquiring, by an image acquisition unit on an upper part of a mounting unit on which the battery cell is disposed, an image of the mounting unit and the battery cell, a height information extraction step of extracting, by a controller, height information of a tab included in the battery cell with respect to a point of the mounting unit from the image, and a battery cell state analysis step of determining, by the controller, a state of the battery cell based on the height information.

20 Claims, 15 Drawing Sheets

DEVICE AND METHOD FOR SENSING STATE OF BATTERY CELL

CROSS-REFERENCE TO RELATED APPLICATION

This application claims priority to Korean Patent Application No. 10-2022-0103510 filed Aug. 18, 2022, the disclosure of which is hereby incorporated herein by reference in its entirety.

BACKGROUND OF THE INVENTION

Field of the Invention

The present disclosure relates to a battery cell state sensing device. More particularly, the present disclosure relates to a device that senses a state of a battery cell disposed on a mounting unit and detects whether a tab is lifted or whether the battery cell is disposed in place.

Description of Related Art

When a battery cell is in an abnormal state because a tab included in the battery cell lifts or sags, a problem may occur in a process of modularizing the battery cells. Alternatively, when a part of the battery cell on a mounting unit spans the mounting unit and are in the abnormal state, a problem may occur in the process of modularizing the battery cells. Therefore, before modularizing the battery cells, it is necessary to find the battery cell of the abnormal state and take action.

In a related art, in order to detect the battery cell of the abnormal state, a worker visually inspected the battery cells. However, since the worker had to perform the inspection while the battery cells were being transported, there was a problem in that the accuracy of the inspection result was low. In addition, because it is difficult to quantify inspection criteria, there was a problem in which the inspection result was unclear.

Accordingly, there is a need for a device capable of accurately sensing the state of the battery cells based on clear criteria.

According to a 'method of inspecting a terminal installed in a battery' disclosed in Japanese Patent No. 3770484 (hereinafter, 'patent document 1'), the method can obtain an image of a battery terminal, on which light is irradiated by lighting, using a camera, calculate a height of the terminal based on the image, and then determine whether the terminal is defective.

In the method disclosed in the 'patent document 1', the lighting and the camera need to be disposed with the battery terminal interposed between them. Since the battery terminal cited as an example in the 'patent document 1' is formed on an upper side of the battery, the lighting and the camera need to be disposed in a horizontal direction of the terminal.

When the battery terminal (tab) disposed on an upper surface of the mounting unit is disposed on a horizontal plane parallel to the upper surface of the mounting unit, it is difficult to sufficiently secure a space to install the lighting or the camera around the terminal because the terminal is surrounded by a base or a wall of the mounting unit. Accordingly, it is difficult to apply the method disclosed in the 'patent document 1'.

PRIOR ART DOCUMENT

Patent Document

Japanese Patent No. 3770484

SUMMARY OF THE INVENTION

An object of the present disclosure is to address the above-described and other problems.

Another object of the present disclosure is to detect whether a tab is lifted based on height information of the tab with respect to a point of a mounting unit.

Another object of the present disclosure is to detect whether a battery cell is normally disposed based on height information of a tab with respect to a point of a mounting unit.

In order to achieve the above-described and other objects and needs, in one aspect of the present disclosure, there is provided a method of sensing a state of a battery cell, the method comprising an image acquisition step of acquiring, by an image acquisition unit on an upper part of a mounting unit on which the battery cell is disposed, an image of the mounting unit and the battery cell, a height information extraction step of extracting, by a controller, height information of a tab included in the battery cell with respect to a point of the mounting unit from the image, and a battery cell state analysis step of determining, by the controller, a state of the battery cell based on the height information.

In another aspect of the present disclosure, there is provided a device of sensing a state of a battery cell disposed on an upper surface of a mounting unit and including a tab, the device comprising an image acquisition unit positioned on an upper part of the mounting unit and configured to acquire an image of the mounting unit and the battery cell, and a controller connected to the image acquisition unit and configured to extract height information of the tab with respect to a point of the mounting unit from the image.

Effects of a device and method for sensing a state of a battery cell according to the present disclosure are described as follows.

According to at least one aspect of the present disclosure, the present disclosure can detect whether a tab is lifted based on height information of the tab with respect to a point of a mounting unit.

According to at least one aspect of the present disclosure, the present disclosure can detect whether a battery cell is normally disposed based on height information of a tab with respect to a point of a mounting unit.

According to at least one aspect of the present disclosure, the present disclosure can extract height information of a tab with respect to a point of a mounting unit from 3D images of the mounting unit and a battery cell acquired using a 3D scanner.

Additional scope of applicability of the present disclosure will become apparent from the detailed description given blow. However, it should be understood that the detailed description and specific examples such as embodiments of the present disclosure are given merely by way of example, since various changes and modifications within the spirit and scope of the present disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of the disclosure, illustrate embodiments of the disclosure and together with the description serve to explain the principle of the disclosure.

FIG. 6 illustrates positions of points P1 and P2 to extract height information when a first tab 220 of the battery cell 200 is lifted.

FIG. 7 illustrates positions of points P1, P2, P3, and P4 to extract height information when the first tab 220 of the battery cell 200 is lifted.

FIG. 8 illustrates positions of points P1 and P2 to extract height information when a part of the battery cell 200 spans a wall 120 of the mounting unit 100.

FIG. 9 illustrates positions of points P1, P2, P3, and P4 to extract height information when a part of the battery cell 200 spans a wall 120 of the mounting unit 100.

DESCRIPTION OF THE INVENTION

Figure 1:
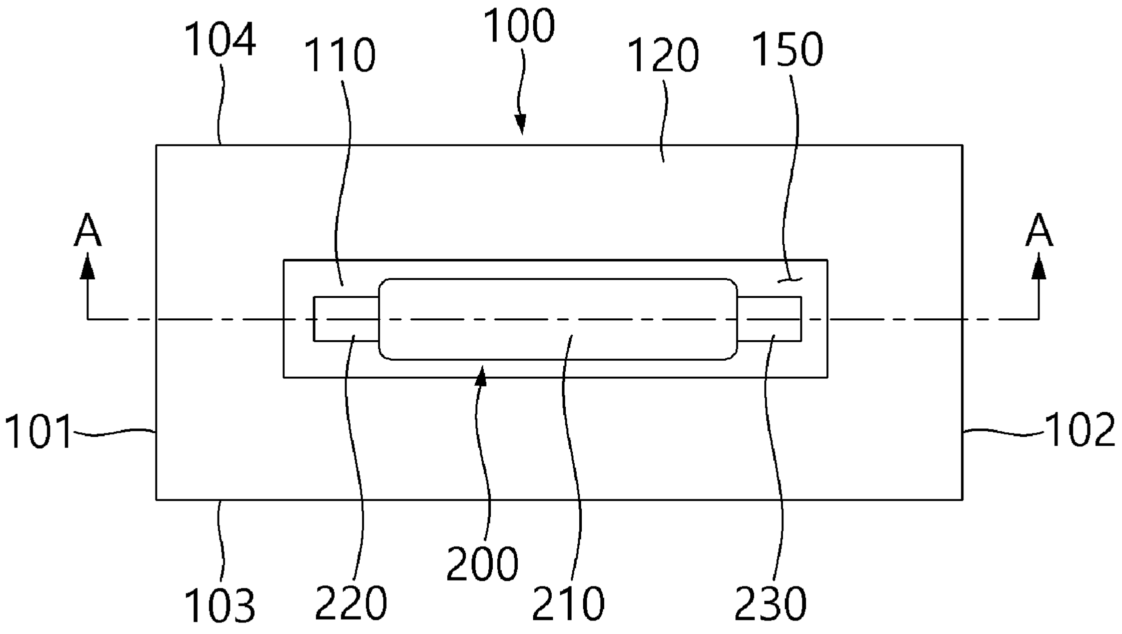
FIG. 1 is a plan view illustrating a battery cell 200 disposed within a mounting unit 100.

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the present disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that embodiments presented herein are not limited by the accompanying drawings. As such, the present disclosure should be construed to extend to any alterations, equivalents and substitutes in addition to those which are particularly set out in the accompanying drawings.

The terms including an ordinal number such as first, second, etc. may be used to describe various components, but the components are not limited by such terms. The terms are used only for the purpose of distinguishing one component from other components.

When any component is described as "being connected" or "being coupled" to other component, this should be understood to mean that another component may exist between them, although any component may be directly connected or coupled to the other component. In contrast, when any component is described as "being directly connected" or "being directly coupled" to other component, this should be understood to mean that no component exists between them.

A singular expression can include a plural expression as long as it does not have an apparently different meaning in context.

In the present disclosure, terms "include" and "have" should be understood to be intended to designate that illustrated features, numbers, steps, operations, components, parts or combinations thereof are present and not to preclude the existence of one or more different features, numbers, steps, operations, components, parts or combinations thereof, or the possibility of the addition thereof.

In the drawings, sizes of the components may be exaggerated or reduced for convenience of explanation. For example, the size and the thickness of each component illustrated in the drawings are arbitrarily illustrated for convenience of explanation, and thus the present disclosure is not limited thereto unless specified as such.

If any embodiment is implementable differently, a specific order of processes may be performed differently from the order described. For example, two consecutively described processes may be performed substantially at the same time, or performed in the order opposite to the described order.

In the following embodiments, when layers, areas, components, etc. are connected, the following embodiments include both the case where layers, areas, and components are directly connected, and the case where layers, areas, and components are indirectly connected to other layers, areas, and components intervening between them. For example, when layers, areas, components, etc. are electrically connected, the present disclosure includes both the case where layers, areas, and components are directly electrically connected, and the case where layers, areas, and components are indirectly electrically connected to other layers, areas, and components intervening between them.

Figure 2:
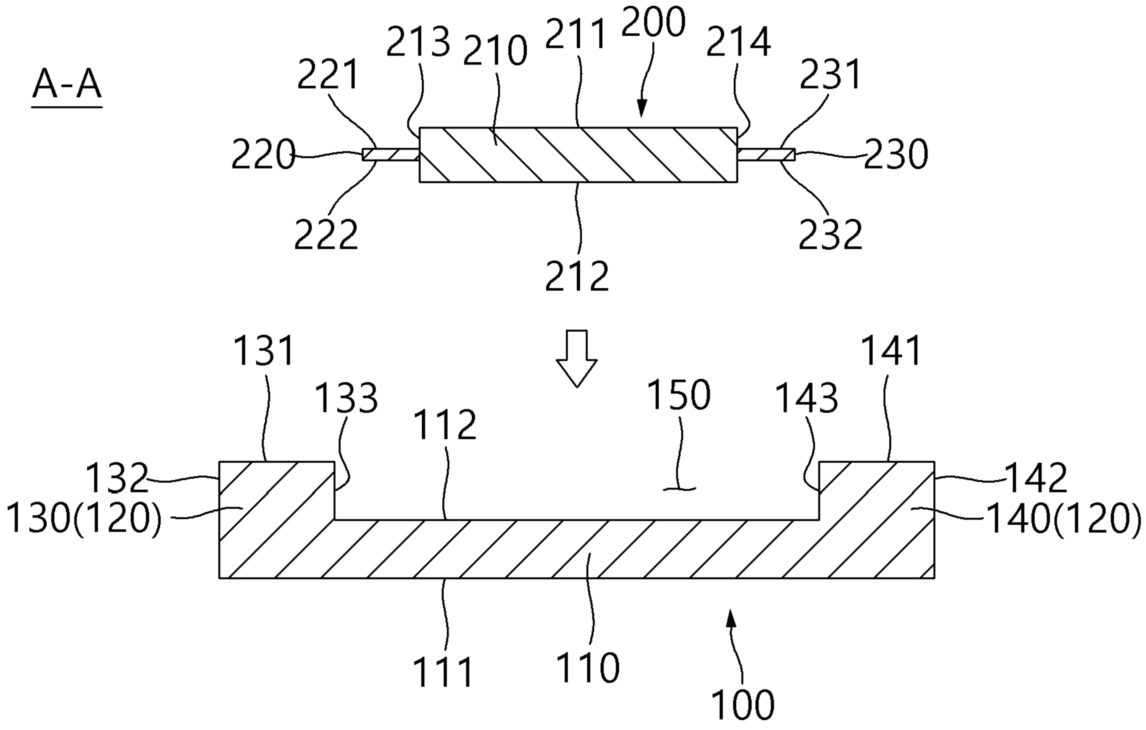
FIG. 2 is an A-A cross-sectional view taken along line A-A of FIG. 1 illustrating that the battery cell 200 is disposed on the mounting unit 100.

FIG. 1 is a plan view illustrating a battery cell 200 disposed within a mounting unit 100. FIG. 2 is an A-A cross-sectional view taken along line A-A of FIG. 1 illustrating that the battery cell 200 is disposed on the mounting unit 100.

The mounting unit 100 may indicate at least a portion of a tray, a container, a plate, a conveyor belt, or a stage.

The mounting unit 100 may extend from one end to other end. For example, the one end of the mounting unit 100 may be a left end 101, and the other end of the mounting unit 100 may be a right end 102. For example, a longitudinal direction of the mounting unit 100 may be parallel to a left-right direction. Further, the mounting unit 100 may extend from a front end 103 to a rear end 104. For example, a width direction of the mounting unit 100 may be parallel to a front-rear direction.

The mounting unit 100 may include a base 110. The base 110 may be formed in the form of a flat plate. For example, the base 110 may be formed in the form of a rectangular plate.

The base 110 may include a base lower surface 111. The base lower surface 111 may be a reference surface when extracting height information of one point of the mounting unit 100 or tabs 220 and 230.

The base 110 may include a base upper surface 112. The base upper surface 112 may be positioned on the base lower surface 111. The battery cell 200 may be disposed on the base upper surface 112.

The mounting unit 100 may include a wall 120. The wall 120 may extend upward from a perimeter of the base upper surface 112.

The wall 120 may include a first wall 130 formed on the left side of the mounting unit 100 and a second wall 140 formed on the right side of the mounting unit 100. The wall 120 may indicate at least one of the first wall 130 and the second wall 140.

The first wall 130 may include a first wall upper surface 131. The first wall upper surface 131 may be parallel to the base upper surface 112.

The first wall 130 may include a first wall outer surface 132. The first wall outer surface 132 may be positioned at the left end 101 of the mounting unit 100.

The first wall 130 may include a first wall inner surface 133. The first wall inner surface 133 may face the second wall 140. The first wall inner surface 133 may face the battery cell 200 disposed on the base upper surface 112.

The second wall 140 may include a second wall upper surface 141. The second wall upper surface 141 may be parallel to the base upper surface 112.

The second wall 140 may include a second wall outer surface 142. The second wall outer surface 142 may be positioned at the right end 102 of the mounting unit 100.

The second wall 140 may include a second wall inner surface 143. The second wall inner surface 143 may face the first wall 130. The second wall inner surface 143 may face the battery cell 200 disposed on the base upper surface 112.

The base upper surface 112 may be positioned between the first wall inner surface 133 and the second wall inner surface 143.

The mounting unit 100 may include an inner space 150 surrounded by the base upper surface 112 and the inner surfaces of the wall 120. For example, the inner space 150 may be surrounded by the base upper surface 112, the first wall inner surface 133, and the second wall inner surface 143. The inner space 150 may have an open upper part. The battery cell 200 may be disposed within the inner space 150.

The battery cell 200 may extend from one end to other end. For example, the one end of the battery cell 200 may be a left end, and the other end of the battery cell 200 may be a right end. A longitudinal direction of the battery cell 200 may be parallel to the left-right direction.

The battery cell 200 may include a cell body 210. The cell body 210 may extend in the longitudinal direction of the battery cell 200.

The cell body 210 may include a cell body upper surface 211. The cell body upper surface 211 may be positioned higher than the tabs 220 and 230.

The cell body 210 may include a cell body lower surface 212. The cell body lower surface 212 may be positioned below the cell body upper surface 211. The cell body lower surface 212 may contact the base upper surface 112.

The cell body 210 may include a cell body left side surface 213. The cell body left side surface 213 may connect a left side of the cell body upper surface 211 and a left side of the cell body lower surface 212. The cell body left side surface 213 may be disposed to face the first wall inner surface 133.

The cell body 210 may include a cell body right side surface 214. The cell body right side surface 214 may connect a right side of the cell body upper surface 211 and a right side of the cell body lower surface 212. The cell body right side surface 214 may be disposed to face the second wall inner surface 143.

The battery cell 200 may include the tabs 220 and 230. The tabs 220 and 230 may include a first tab 220 and a second tab 230. The taps 220 and 230 may indicate at least one of the first tap 220 and the second tap 230.

The first tab 220 may extend from the cell body left side surface 213. For example, the first tab 220 may extend in the longitudinal direction of the battery cell 200. The first tab 220 may be disposed between the first wall 130 and the cell body 210.

The first tab 220 may include a first tab upper surface 221. The first tab upper surface 221 may be positioned below the cell body upper surface 211. The first tab upper surface 221 may be positioned below the first wall upper surface 131. When one point of the first tab upper surface 221 is raised, the first tab 220 may be in a lifted state.

The first tap 220 may include a first tap lower surface 222. The first tab lower surface 222 may face the base upper surface 112. The first tap lower surface 222 may be spaced apart from the base upper surface 112.

The second tap 230 may extend from the cell body right side surface 214. For example, the second tap 230 may extend in the longitudinal direction of the battery cell 200. The second tap 230 may be disposed between the second wall 140 and the cell body 210.

The second tap 230 may include a second tab upper surface 231. The second tab upper surface 231 may be positioned below the cell body upper surface 211. The second tab upper surface 231 may be positioned below the second wall upper surface 141. When one point of the second tab upper surface 231 is raised, the second tap 230 may in a lifted state.

The second tap 230 may include a second tap lower surface 232. The second tap lower surface 232 may face the base upper surface 112. The second tap lower surface 232 may be spaced apart from the base upper surface 112.

Figure 3:
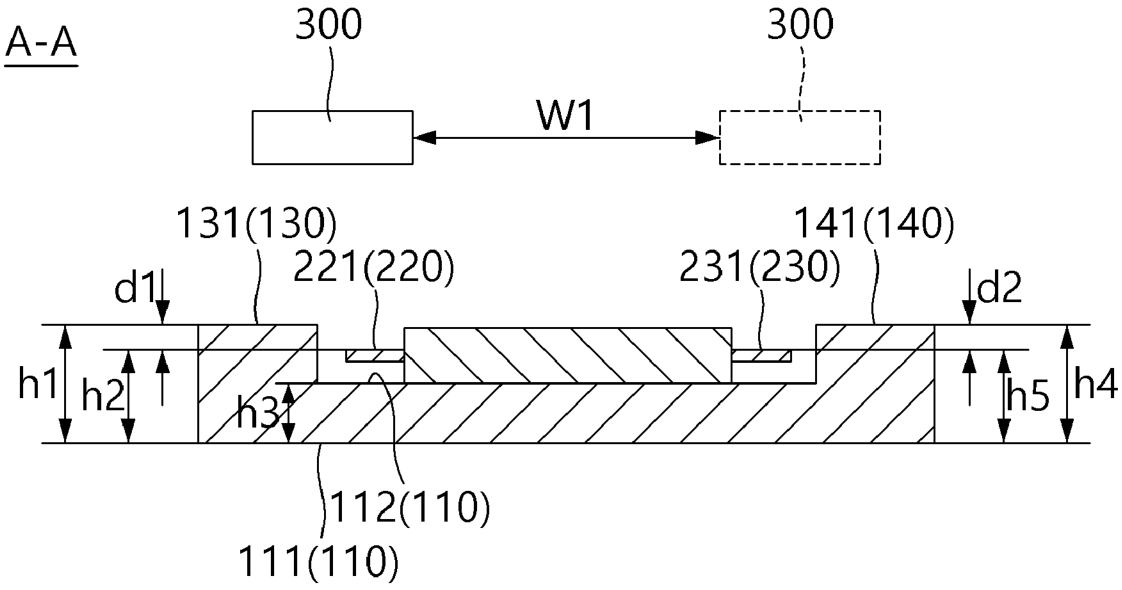
FIG. 3 is an A-A cross-sectional view illustrating the mounting unit 100 and the battery cell 200 of FIG. 2 and an image acquisition unit 300 according to an embodiment of the present disclosure.

FIG. 3 is an A-A cross-sectional view illustrating the mounting unit 100 and the battery cell 200 of FIG. 2 and an image acquisition unit 300 according to an embodiment of the present disclosure.

A state in which the battery cell 200 is normally disposed on the mounting unit 100 may be referred to as a normal state ST1, and a state in which the battery cell 200 is abnormally disposed on the mounting unit 100 may be referred to as an abnormal state ST2.

The normal state ST1 may refer to a state in which the taps 220 and 230 are not lifted. The normal state ST1 may refer to a state in which the tabs 220 and 230 do not sag. The normal state ST1 may refer to a state in which the battery cell 200 does not span the wall 120 of the mounting unit 100.

The abnormal state ST2 may refer to a state in which the taps 220 and 230 are lifted. The abnormal state ST2 may refer to a state in which the tabs 220 and 230 sag. The abnormal state ST2 may refer to a state in which the battery cell 200 spans the wall 120 of the mounting unit 100.

The image acquisition unit 300 may be disposed on the mounting unit 100. The image acquisition unit 300 may be disposed on the battery cell 200. The image acquisition unit 300 may acquire images of the mounting unit 100 and the battery cell 200. Images acquired by the image acquisition unit 300 may be images of the mounting unit 100 and the battery cell 200 viewed from above.

The image acquisition unit 300 may include a 3D scanner. An image acquired by the image acquisition unit 300 may be a 3D image. The 3D image may include height information of a point on the image. The height information may be height information measured based on the base lower surface 111.

A direction in which the first wall 130 faces the second wall 140 or a direction in which the second wall 140 faces the first wall 130 may be referred to as a first direction W1. The image acquisition unit 300 may move in the first direction W1. The image acquisition unit 300 may move in the first direction W1 by a driver (not shown). The driver may include a motor, a rail, etc. The rail may extend in the first direction W1.

The image acquisition unit 300 may move in the first direction W1 and may move between an upper part of the first wall 130 and an upper part of the second wall 140. For example, the image acquisition unit 300 may acquire an image including the first wall 130 and the first tab 220 at the upper part of the first wall 130. For example, the image acquisition unit 300 may acquire an image including the second wall 140 and the second tab 230 at the upper part of the second wall 140.

The image acquisition unit 300 may acquire height information for a point of the first wall 130. For example, the image acquisition unit 300 may acquire height information for a point of the first wall upper surface 131. The height information for a point of the first wall upper surface 131 may be referred to as a first height h1.

The image acquisition unit 300 may acquire height information for a point of the first tab 220. For example, the image acquisition unit 300 may acquire height information for a point of the first tab upper surface 221. The height information for a point of the first tab upper surface 221 may be referred to as a second height h2.

The image acquisition unit 300 may acquire height information for the base upper surface 112. The height information for the base upper surface 112 may be referred to as a third height h3.

The image acquisition unit 300 may acquire height information for a point of the second wall 140. For example, the image acquisition unit 300 may acquire height information for a point of the second wall upper surface 141. The height information for a point of the second wall upper surface 141 may be referred to as a fourth height h4.

The image acquisition unit 300 may acquire height information for a point of the second tab 230. For example, the image acquisition unit 300 may acquire height information for a point of the second tab upper surface 231. The height information for a point of the second tab upper surface 231 may be referred to as a fifth height h5.

A value obtained by subtracting the second height h2 from the first height h1 may be referred to as a first height difference d1. When the first height difference d1 is within a preset range, it may be determined that the first tap 220 is in the normal state ST1. When the first height difference d1 is out of the preset range and is less than a minimum value of the preset range, it may be determined that the first tap 220 is lifted and is in the abnormal state ST2. When the first height difference d1 is out of the preset range and is greater than a maximum value of the preset range, it may be determined that the first tap 220 sags and is in the abnormal state ST2. When the second height h2 is close to the fifth height h5, it may be determined that the first tab 220 is in contact with the base upper surface 112 and is in the abnormal state ST2.

When the first height difference d1 is greater than or equal to a preset value d0, it may be determined that the first tap 220 is not lifted. When the first height difference d1 is less than the preset value d0, it may be determined that the first tap 220 is lifted. The preset value d0 may be the minimum value of the preset range.

A value obtained by subtracting the fourth height h4 from the third height h3 may be referred to as a second height difference d2. When the second height difference d2 is within the preset range, it may be determined that the second tap 230 is in the normal state ST1. When the second height difference d2 is out of the preset range and is less than the minimum value of the preset range, it may be determined that the second tap 230 is lifted and is in the abnormal state ST2. When the second height difference d2 is out of the preset range and is greater than the maximum value of the preset range, it may be determined that the second tap 230 sags and is in the abnormal state ST2. When the fourth height h4 is close to the fifth height h5, it may be determined that the second tab 230 is in contact with the base upper surface 112 and is in the abnormal state ST2.

When the second height difference d2 is greater than or equal to the preset value d0, it may be determined that the second tap 230 is not lifted. When the second height difference d2 is less than the preset value d0, it may be determined that the second tap 230 is lifted. The preset value d0 may be the minimum value of the preset range.

Figure 4:
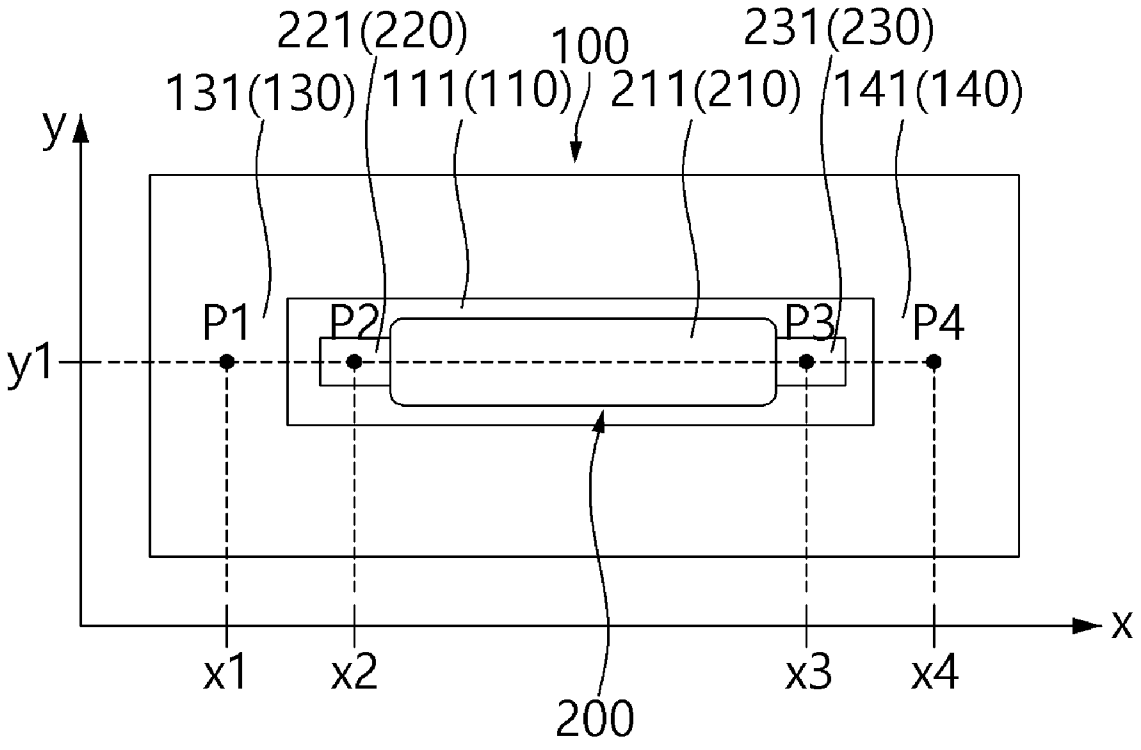
FIG. 4 illustrates, on xy plane, positions of points P1, P2, P3, and P4 to extract height information from images of the mounting unit 100 and the battery cell 200 acquired by the image acquisition unit 300.

FIG. 4 illustrates, on a horizontal plane, positions of points P1, P2, P3, and P4 to extract height information from images of the mounting unit 100 and the battery cell 200 acquired by the image acquisition unit 300. The horizontal plane may be xy plane. The points P1, P2, P3, and P4 may indicate at least one of a first point P1, a second point P2, a third point P3, and a fourth point P4.

The first point P1 may be a point extracting height information for a point of the first wall 130. For example, the first point P1 may be a point positioned on the first wall upper surface 131. Coordinates of the first point P1 are (x1, y1), which may be referred to as a first coordinate.

The second point P2 may be a point extracting height information for a point of the first tap 220. For example, the second point P2 may be a point adjacent to a boundary between the base 110 and the first wall 130. The second point P2 may be positioned within the inner space 150. For example, the second point P2 may be a point positioned on the first tab upper surface 221 of the normal state ST1. Coordinates of the second point P2 are (x2, y1), which may be referred to as a second coordinate.

The third point P3 may be a point extracting height information for a point of the second tap 230. For example, the third point P3 may be a point adjacent to a boundary between the base 110 and the second wall 140. The third point P3 may be positioned within the inner space 150. For example, the third point P3 may be a point positioned on the second tab upper surface 231 of the normal state ST1. Coordinates of the third point P3 are (x3, y1), which may be referred to as a third coordinate.

The fourth point P4 may be a point extracting height information for a point of the second wall 140. For example, the fourth point P4 may be a point positioned on the second wall upper surface 141. Coordinates of the fourth point P4 are (x4, y1), which may be referred to as a fourth coordinate.

Positions of the first point P1, the second point P2, the third point P3, and the fourth point P4 on the xy plane may be same regardless of the state of the battery cell 200. The first point P1 may be positioned at any one of the first wall upper surface 131, the first tab upper surface 221, and the cell body upper surface 211. The second point P2 may be positioned at any one of the first tab upper surface 221, the cell body upper surface 211, and the base upper surface 112. The third point P3 may be positioned at any one of the second tab upper surface 231, the cell body upper surface 211, and the base upper surface 112. The fourth point P4 may be positioned at any one of the second wall upper surface 141, the second tab upper surface 231, and the cell body upper surface 211.

Height information of the first point P1 may be height information of an object placed at a point corresponding to the x and y coordinates of the first point P1 based on images photographed by the image acquisition unit 300. For example, when the first wall 130 is at a point of the coordinates (x1, y1) based on the images, the height information of the first point P1 may be a height of a point corresponding to the coordinates (x1, y1) in the first wall upper surface 131. The height of the point corresponding to the coordinates (x1, y1) may be extracted from the image, which may be referred to as a first point height h_P1.

Height information of the second point P2, height information of the third point P3, and height information of the fourth point P4 may be extracted in the same method as the method of extracting the height information of the first point P1. A height extracted at a point corresponding to the coordinates (x2, y1) may be referred to as a second point height h_P2. A height extracted at a point corresponding to the coordinates (x3, y1) may be referred to as a third point height h_P3. A height extracted at a point corresponding to the coordinates (x4, y1) may be referred to as a second point height h_P4.

Figure 5:
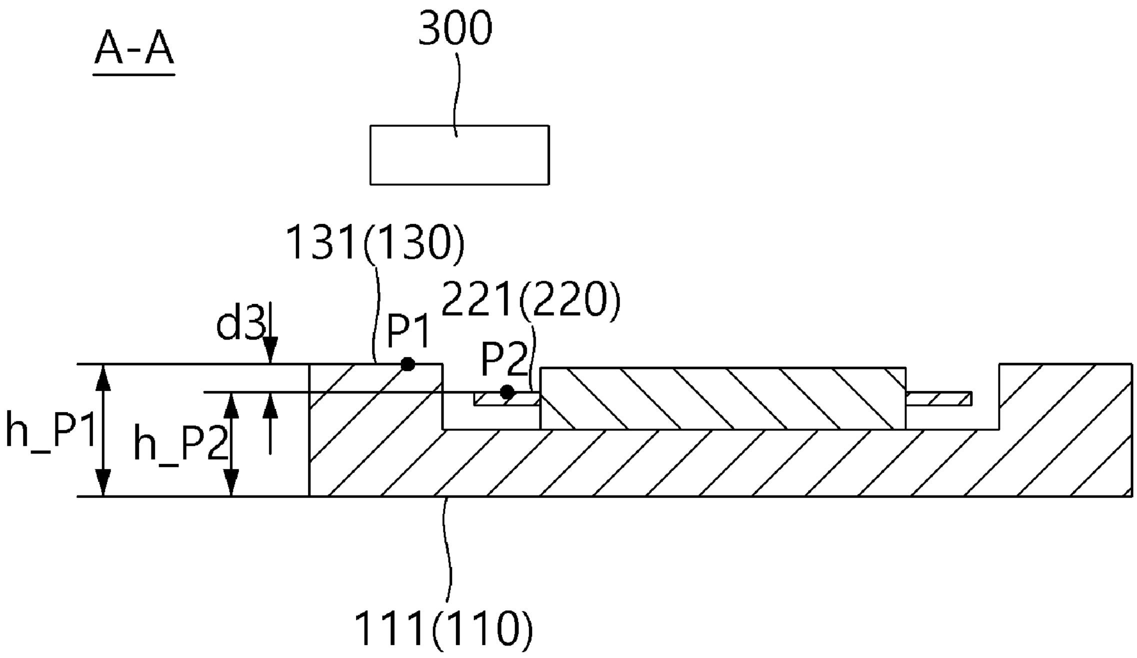
FIG. 5 is an A-A cross-sectional view illustrating positions of points P1 and P2 to extract height information at the mounting unit 100 and the battery cell 200 of FIG. 3.

FIG. 5 is an A-A cross-sectional view illustrating positions of points P1 and P2 to extract height information at the mounting unit 100 and the battery cell 200 of FIG. 3.

The first point P1 may be positioned on the first wall upper surface 131. The second point P2 may be positioned on the first tab upper surface 221. A value obtained by subtracting the second point height h_P2 from the first point height h_P1 may be referred to as a third height difference d3.

When the third height difference d3 is within the preset range, it may be determined that the first tap 220 is in the normal state ST1. When the third height difference d3 is out of the preset range and is less than the minimum value of the preset range, it may be determined that the first tap 220 is lifted and is in the abnormal state ST2. When the third height difference d3 is out of the preset range and is greater than the maximum value of the preset range, it may be determined that the first tap 220 sags and is in the abnormal state ST2.

As illustrated in FIG. 5, in the normal state ST1, the third height difference d3 may be greater than or equal to the preset value d0. The preset value d0 may indicate the minimum value of the preset range.

Figure 6:
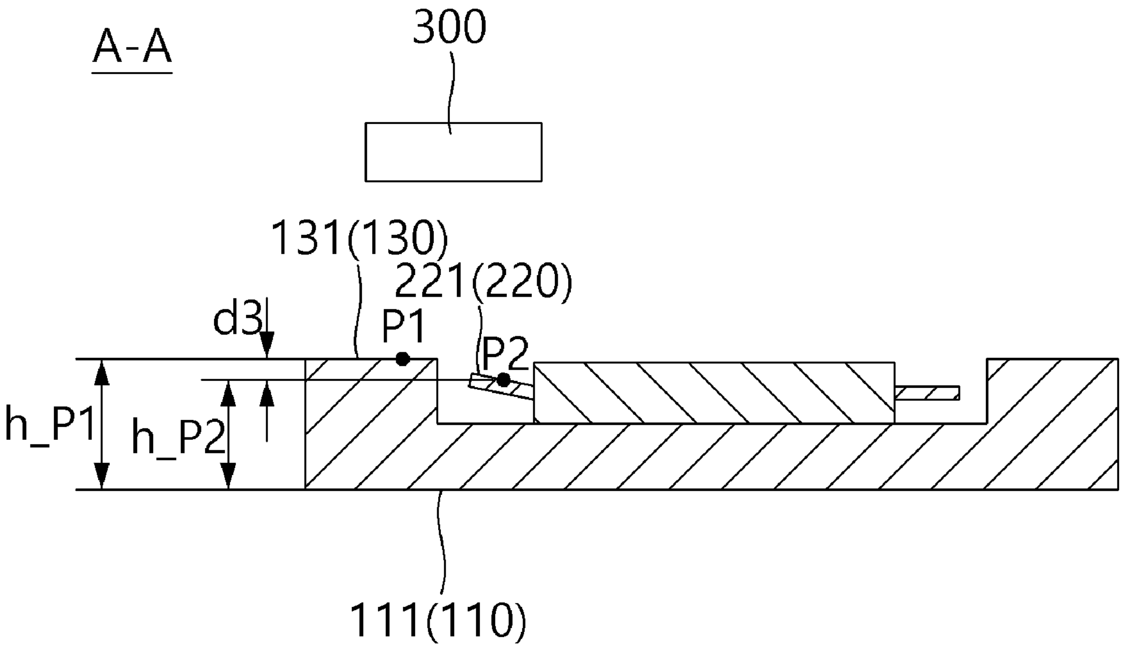
FIGS. 6 to 9 illustrate the battery cell 200 of an abnormal state within the mounting unit 100.

FIGS. 6 to 9 illustrate the battery cell 200 of the abnormal state within the mounting unit 100. FIG. 6 illustrates positions of the points P1 and P2 to extract height information when the first tab 220 of the battery cell 200 is lifted.

As illustrated in FIG. 6, when the first tab 220 is lifted, the first tab upper surface 221 may rise further than the first tab upper surface 221 in the normal state ST1. Hence, since the second point P2 rises, the third height difference d3 may decrease. When the third height difference d3 is out of the preset range, it may be determined that the first tab 220 is in the abnormal state ST2.

The third height difference d3 may be less than the preset value d0. The preset value d0 may indicate the minimum value of the preset range. The third height difference d3 may be a positive number, zero or a negative number that are less than the preset value d0.

Figure 7:
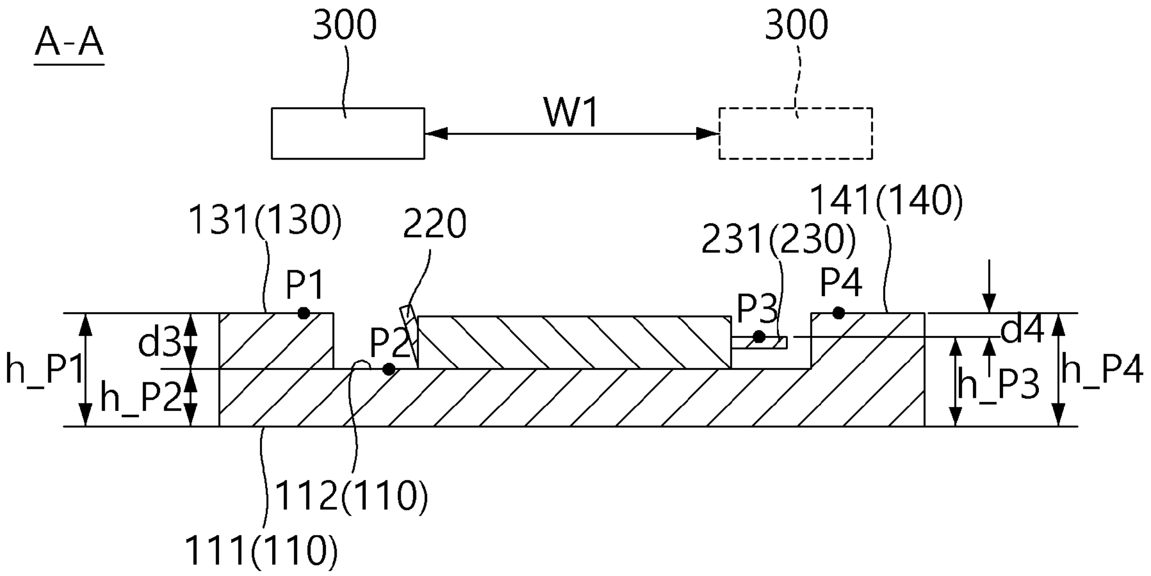

FIG. 7 illustrates positions of points P1, P2, P3, and P4 to extract height information when the first tab 220 of the battery cell 200 is lifted.

When the second point P2 is positioned on the first tap 220, the third height difference d3 may decrease as the first tap 220 is lifted. When the first tab 220 is lifted above a predetermined angle with respect to the base upper surface 112, the first tab 220 may deviate from the second point P2. Hence, the second point P2 may be positioned on the base upper surface 112. As a result, as an angle formed by the first tab 220 and the base upper surface 112 increases, the third height difference d3 may gradually decrease, and the third height difference d3 may increase when the angle reaches the predetermined angle. The third height difference d3 at the predetermined angle may be equal to a value obtained by subtracting a height of the base upper surface 112 from a height of the first wall upper surface 131.

When the third height difference d3 is equal to the value obtained by subtracting the height of the base upper surface 112 from the height of the first wall upper surface 131, it may be determined that the first tab 220 is lifted above the predetermined angle. Alternatively, it may be determined that the first tap 220 is not present. Alternatively, it may be determined that the battery cell 200 is not present.

In order to determine the presence or absence of the battery cell 200, the third point height h_P3 and the fourth point height h_P4 may be extracted and analyzed. The third point P3 may be positioned on the second tab upper surface 231. The fourth point P4 may be positioned on the second wall upper surface 141. A value obtained by subtracting the third point height h_P3 from the fourth point height h_P4 may be referred to as a fourth height difference d4.

When the fourth height difference d4 is within the preset range, it may be determined that the second tap 230 is in the normal state ST1. When the fourth height difference d4 is out of the preset range and is less than the minimum value of the preset range, it may be determined that the second tap 230 is lifted and is in the abnormal state ST2. When the fourth height difference d4 is out of the preset range and is greater than the maximum value of the preset range, it may be determined that the second tap 230 sags and is in the abnormal state ST2.

When the fourth height difference d4 is equal to a value obtained by subtracting a height of the base upper surface 112 from a height of the second wall upper surface 141, it may be determined that the second tab 230 is lifted above the predetermined angle. Alternatively, it may be determined that the second tab 230 is not present. Alternatively, it may be determined that the battery cell 200 is not present.

When it is determined that the base upper surface 112 has been detected at both the second point P2 and the third point P3, it may be determined that both the first tab 220 and the second tab 230 are not in place. Alternatively, it may be determined that the battery cell 200 is not present.

In order to determine the presence or absence of the battery cell 200, it may be analyzed whether there is a point higher than the second point height h_P2 or the third point height h_P3 by extracting height information from coordinates between the second point P2 and the third point P3 in the first direction W1. If there is a point higher than the second point height h_P2 or the third point height h_P3, it may be determined that the battery cell 200 exists, but both the tabs 220 and 230 have a problem. If there is no point higher than the second point height h_P2 or the third point height h_P3, it may be determined that the battery cell 200 is not present.

Figure 8:
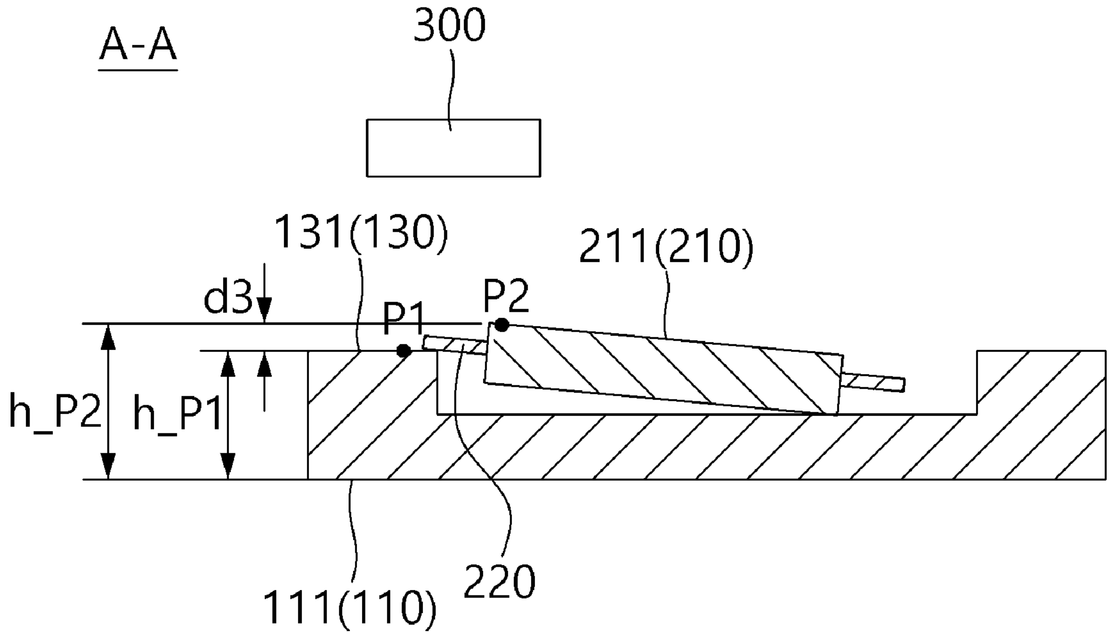

FIG. 8 illustrates positions of points P1 and P2 to extract height information when a part of the battery cell 200 spans the wall 120 of the mounting unit 100.

As illustrated in FIG. 8, when the first tab 220 spans the first wall 130, the second point P2 may be positioned on the cell body 210. The second point P2 may be positioned on the cell body upper surface 211. Hence, because the second point P2 is higher than the first point P1, the third height difference d3 may be a negative number. When the third height difference d3 is the negative number, it may be determined that the battery cell 200 is in the abnormal state ST2 and spans the wall 120.

Figure 9:
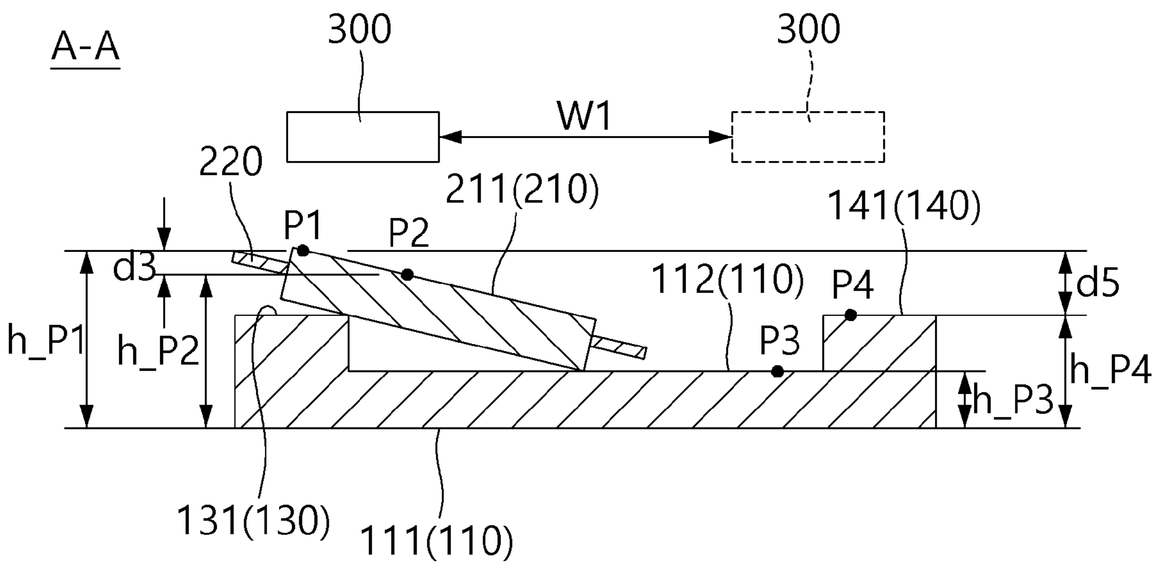

FIG. 9 illustrates positions of points P1, P2, P3, and P4 to extract height information when a part of the battery cell 200 spans the wall 120 of the mounting unit 100.

As illustrated in FIG. 9, when the cell body 210 spans the first wall 130, the first point P1 and the second point P2 may be positioned on the cell body 210. The first point P1 and the second point P2 may be positioned on the cell body upper surface 211. Depending on an angle between the cell body 210 and the base 110, the third height difference d3 may be within the preset range. In order to prevent an error in which the state of the battery cell 200 illustrated in FIG. 9 is determined to be the normal state ST1, it may be determined whether the position of the battery cell 200 is in the normal state ST1. To this end, it may be checked whether the first point height h_P1 is normal.

In order to check whether the first point height h_P1 is normal, it may be checked whether the first point P1 is positioned on the first wall 130. In the normal state ST1, the first point P1 may be positioned on the first wall 130, and the fourth point P4 may be positioned on the second wall 140. Therefore, in the normal state ST1, the first point height h_P1 and the fourth point height h_P4 may be the same. Hence, when a fifth height difference d5 obtained by subtracting the fourth point height h_P4 from the first point height h_P1 is within a predetermined range, it may be determined the first point height h_P1 is normal. The predetermined range may include a manufacturing error range between the first wall 130 and the second wall 140.

When the fifth height difference d5 is out of the predetermined range, it may be determined that the state of the battery cell 200 is the abnormal state ST2. If the fifth height difference d5 is a positive number outside the predetermined range, it may be determined that the first point P1 is positioned on the first tab 220 or the cell body 210. If the fifth height difference d5 is a negative number outside the predetermined range, it may be determined that the fourth point P4 is positioned on the second tab 230 or the cell body 210.

Figure 10:
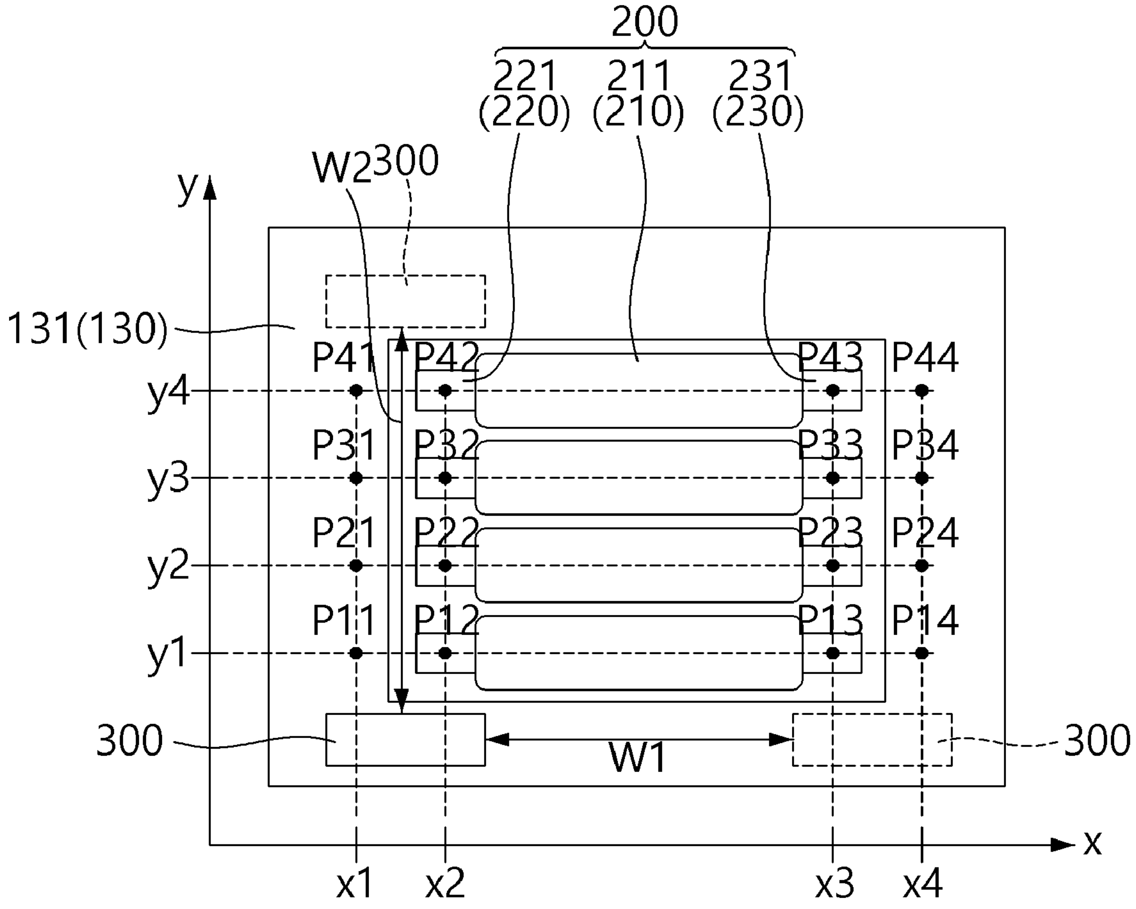
FIG. 10 illustrates, on xy plane, positions of points to extract height information from images of the mounting unit 100 and a plurality of battery cells 200 acquired by the image acquisition unit 300.

FIG. 10 illustrates, on xy plane, positions of points to extract height information from images of the mounting unit 100 and a plurality of battery cells 200 acquired by the image acquisition unit 300.

The plurality of battery cells 200 may be arranged in parallel in the y direction, and each battery cell 200 may extend in the x direction. The x direction may be referred to as the first direction W1, and the y direction may be referred to as a second direction W2. The image acquisition unit 300 may move in the first direction W1 or the second direction W2. The image acquisition unit 300 may move in the first direction W1 or the second direction W2 by the driver (not shown). The driver may include a motor, a first rail extending in the first direction W1, a second rail extending in the second direction W2, and the like.

Points from which height information is extracted to determine the state of one battery cell 200 may have the same y-coordinate. For example, y-coordinates of a 11th point P11, a 12th point P12, a 13th point P13, and a 14th point P14 may be a first y value y1. For example, y-coordinates of a 21th point P21, a 22th point P22, a 23th point P23, and a 24th point P24 may be a second y value y2. For example, y-coordinates of a 31th point P31, a 32th point P32, a 33th point P33, and a 34th point P34 may be a third y value y3. For example, y-coordinates of a 41th point P41, a 42th point P42, a 43th point P43, and a 44th point P44 may be a fourth y value y4.

Points from which height information of a point of the first wall 130 is extracted may have the same x-coordinate. For example, x-coordinates of the 11th point P11, the 21th point P21, the 31th point P31, and the 41th point P41 may be a first x value x1.

Points from which height information of a point of the first tab 220 is extracted may have the same x-coordinate. For example, x-coordinates of the 12th point P12, the 22th point P22, the 32th point P32, and the 42th point P42 may be a second x value x2.

Points from which height information of a point of the second tab 230 is extracted may have the same x-coordinate. For example, x-coordinates of the 13th point P13, the 23th point P23, the 33th point P33, and the 43th point P43 may be a third x value x3.

Points from which height information of a point of the second wall 140 is extracted may have the same x-coordinate. For example, x-coordinates of the 14th point P14, the 24th point P24, the 34th point P34, and the 44th point P44 may be a fourth x value x4.

Figure 11:
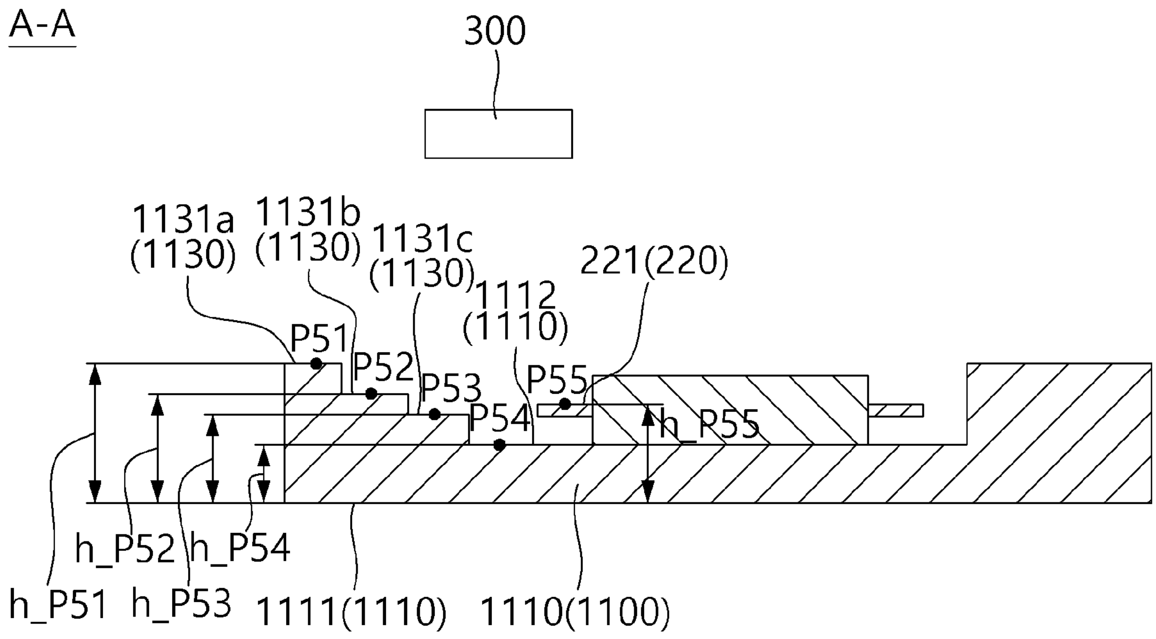
FIG. 11 is an A-A cross-sectional view illustrating points to extract height information at a mounting unit 1100 and a battery cell 200 according to another embodiment of the present disclosure.

FIG. 11 is an A-A cross-sectional view illustrating points to extract height information at a mounting unit 1100 and a battery cell 200 according to another embodiment of the present disclosure.

The mounting unit 1100 may be different from the mounting unit 100 illustrated in FIG. 2 in a shape of a first wall 1130.

The mounting unit 1100 may include the first wall 1130 having a plurality of upper surfaces with different heights. The upper surface of the first wall 1130 may increase in height as it is disposed closer to an outer side of the first wall 1130. The first wall 1130 may be formed in a step shape going down from the outer side to an inner side of the first wall 1130. In FIG. 11, the outer side of the first wall 1130 may be a left side, and the inner side of the first wall 1130 may be a right side.

The image acquisition unit 300 may acquire images of the mounting unit 1100 and the battery cell 200. Based on the images acquired by the image acquisition unit 300 moving from the left side to the right side in FIG. 11, height information for a point of the mounting unit 1100 or height information for a point of the battery cell 200 may be extracted.

For example, the first wall 1130 may include three upper surfaces 1131*a*, 1131*b*, and 1131*c*. The upper surfaces 1131*a*, 1131*b*, and 1131*c* of the first wall 1130 may indicate at least one of the first upper surface 1131*a*, the second upper surface 1131*b*, and the third upper surface 1131*c*.

The first upper surface 1131*a* may be disposed on the outer side of the first wall 1130. The first upper surface 1131*a* may be higher than an upper surface of the battery cell 200 (see FIG. 2) disposed in the inner space 150 (see FIG. 2).

The second upper surface 1131*b* may be disposed on the inner side of the first wall 1130 compared to the first upper surface 1131*a*. The second upper surface 1131*b* may be lower than the first upper surface 1131*a*. A height of the second upper surface 1131*b* may be equal to a maximum height when cell tabs 220 and 230 are in the normal state ST1.

The third upper surface 1131*c* may be disposed on the inner side of the first wall 1130 compared to the second upper surface 1131*b*. The third upper surface 1131*c* may be lower than the second upper surface 1131*b*. The third upper surface 1131*c* may be disposed between the second upper surface 1131*b* and a base upper surface 1112. The third upper surface 1131*c* may be higher than the base upper surface 1112. A height of the third upper surface 1131*c* may be equal to a minimum height when the cell tabs 220 and 230 are in the normal state ST1.

When a height of a first tab upper surface 221 is less than or equal to the height of the second upper surface 1131*b*, the first tab 220 may not be lifted. When the height of the first tab upper surface 221 is greater than or equal to the height of the third upper surface 1131*c*, the first tab 220 may not sag. When the height of the first tab upper surface 221 is less than or equal to the height of the second upper surface 1131*b* and is greater than or equal to the height of the third upper surface 1131*c*, the first tab 220 may be in the normal state ST1.

For example, the image acquisition unit 300 may acquire an image including a 51th point P51 that is a point on the first upper surface 1131*a*, a 52th point P52 that is a point on the second upper surface 1131*b*, a 53th point P53 that is a point on the third upper surface 1131*c*, a 54th point P54 that is a point on the base upper surface 1112, and a 55th point P55 that is a point on the first tab upper surface 221.

Based on the image acquired by the image acquisition unit 300, height information corresponding to a 51th point height h P51 that is a height of the 51th point P51, a 52th point height h_P52 that is a height of the 52th point P52, a 53th point height h_P53 that is a height of the 53th point P53, a 54th point height h P54 that is a height of the 54th point P54, and a 55th point height h_P55 that is a height of the 55th point P55 may be extracted. The height information may be a height measured based on a base lower surface 1111.

The 51th point P51 may be a reference point. The 51th point height h P51 may be a reference height. When height information less than the 51th point height h P51 is extracted by sequentially extracting height information of points positioned on the right side of the 51th point P51, this point may be referred to as the 52th point P52.

When height information less than the 52th point height h_P52 is extracted by sequentially extracting height information of points positioned on the right side of the 52th point P52, this point may be referred to as the 53th point P53.

When height information less than the 53th point height h_P53 is extracted by sequentially extracting height information of points positioned on the right side of the 53th point P53, this point may be referred to as the 54th point P54.

When height information greater than the 54th point height h P54 is extracted by sequentially extracting height information of points positioned on the right side of the 54th point P54, this point may be referred to as the 55th point P55. When the 55th point height h_P55 is less than or equal to the 52th point height h_P52 and is greater than or equal to the 53th point height h_P53, the first tab 220 may be in the normal state ST1. When the 55th point height h_P55 exceeds the 52th point height h_P52, the first tab 220 may be in the abnormal state ST2. When the 55th point height h_P55 is less than the 53th point height h_P53, the first tab 220 may be in the abnormal state ST2.

Figure 12:
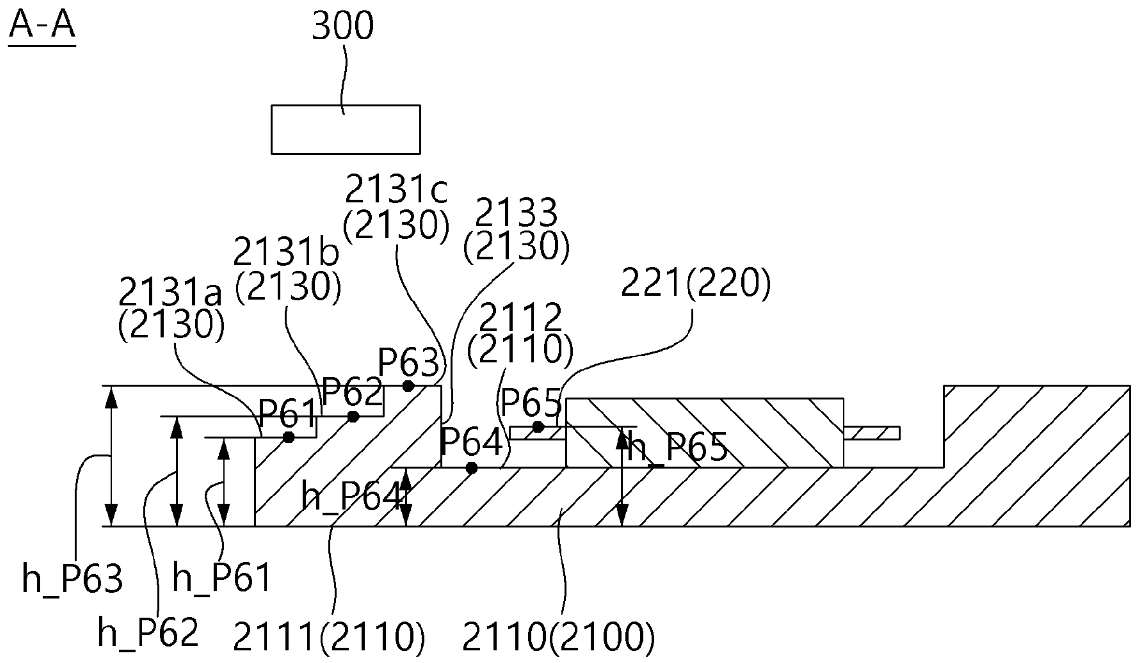
FIG. 12 is an A-A cross-sectional view illustrating points to extract height information at a mounting unit 2100 and a battery cell 200 according to another embodiment of the present disclosure.

FIG. 12 is an A-A cross-sectional view illustrating points to extract height information at a mounting unit 2100 and a battery cell 200 according to another embodiment of the present disclosure.

The mounting unit 2100 may be different from the mounting unit 100 illustrated in FIG. 2 in a shape of a first wall 2130.

The mounting unit 2100 may include the first wall 2130 having a plurality of upper surfaces with different heights. The upper surface of the first wall 2130 may decrease in height as it is disposed closer to an outer side of the first wall 2130. The first wall 2130 may be formed in a step shape going up from the outer side to an inner side of the first wall 2130. In FIG. 12, the outer side of the first wall 2130 may be a left side, and the inner side of the first wall 2130 may be a right side.

The image acquisition unit 300 may acquire images of the mounting unit 2100 and the battery cell 200. Based on the images acquired by the image acquisition unit 300 moving from the left side to the right side in FIG. 12, height information for a point of the mounting unit 2100 or height information for a point of the battery cell 200 may be extracted.

For example, the first wall 2130 may include three upper surfaces 2131*a*, 2131*b*, and 2131*c*. The upper surfaces 2131*a*, 2131*b*, and 2131*c* of the first wall 2130 may indicate at least one of the first upper surface 2131*a*, the second upper surface 2131*b*, and the third upper surface 2131*c*.

The first upper surface 2131*a* may be disposed on the outer side of the first wall 2130. The first upper surface 2131*a* may be higher than a base upper surface 2112. A height of the first upper surface 2131*a* may be equal to a minimum height when cell tabs 220 and 230 are in the normal state ST1.

The second upper surface 2131*b* may be disposed on the inner side of the first wall 2130 compared to the first upper surface 2131*a*. The second upper surface 2131*b* may be higher than the first upper surface 2131*a*. A height of the second upper surface 2131*b* may be equal to a maximum height when the cell tabs 220 and 230 are in the normal state ST1.

The third upper surface 2131*c* may be disposed on the inner side of the first wall 2130 compared to the second upper surface 2131*b*. The third upper surface 2131*c* may be higher than the second upper surface 2131*b*. The third upper surface 2131c may be disposed between the second upper surface 2131b and the base upper surface 2112.

The third upper surface 2131c may be higher than a height of the upper surface of the battery cell 200. An inner end of the third upper surface 2131c may be connected to a first wall inner surface 2133. A height direction length of the first wall inner surface 2133 may be greater than a height direction length of the battery cell 200. Hence, the battery cell 200 may not interfere with the first upper surface 2131a or the second upper surface 2131b.

When a height of a first tab upper surface 221 is greater than or equal to the first upper surface 2131a, the first tab 220 may not sag. When the height of the first tab upper surface 221 is less than or equal to the second upper surface 2131b, the first tab 220 may not be lifted. When the height of the first tab upper surface 221 is greater than or equal to the first upper surface 2131a and is less than or equal to the second upper surface 2131b, the first tab 220 may be in the normal state ST1.

For example, the image acquisition unit 300 may acquire an image including a 61th point P61 that is a point on the first upper surface 2131a, a 62th point P62 that is a point on the second upper surface 2131b, a 63th point P63 that is a point on the third upper surface 2131c, a 64th point P64 that is a point on the base upper surface 2112, and a 65th point P65 that is a point on the first tab upper surface 221.

Based on the image acquired by the image acquisition unit 300, height information corresponding to a 61th point height h_P61 that is a height of the 61th point P61, a 62th point height h_P62 that is a height of the 62th point P62, a 63th point height h P63 that is a height of the 63th point P63, a 64th point height h P64 that is a height of the 64th point P64, and a 65th point height h_P65 that is a height of the 65th point P65 may be extracted. The height information may be a height measured based on a base lower surface 2111.

The 61th point P61 may be a reference point. The 61th point height h_P61 may be a reference height. When height information greater than the 61th point height h_P61 is extracted by sequentially extracting height information of points positioned on the right side of the 61th point P61, this point may be referred to as the 62th point P62.

When height information greater than the 62th point height h_P62 is extracted by sequentially extracting height information of points positioned on the right side of the 62th point P62, this point may be referred to the 63th point 63.

When height information less than the 63th point height h P63 is extracted by sequentially extracting height information of points positioned on the right side of the 63th point P63, this point may be referred to as the 64th point 654.

When height information greater than the 64th point height h P64 is extracted by sequentially extracting height information of points positioned on the right side of the 64th point P64, this point may be referred to as the 65th point P65. When the 65th point height h_P65 is greater than or equal to the 61th point height h_P61 and is less than or equal to the 62th point height h_P62, the first tab 220 may be in the normal state ST1. When the 65th point height h_P65 is less than the 61th point height h_P61, the first tab 220 may be in the abnormal state ST2. When the 65th point height h_P65 exceeds the 62th point height h_P62, the first tab 220 may be in the abnormal state ST2.

Figure 13:
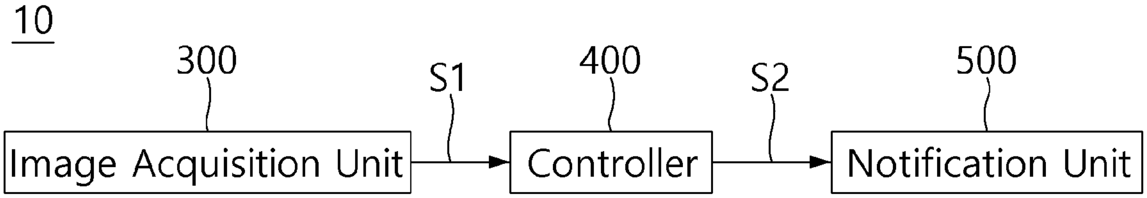
FIG. 13 is a block diagram of a battery cell state sensing device 10 according to an embodiment of the present disclosure.

FIG. 13 is a block diagram of a battery cell state sensing device 10 according to an embodiment of the present disclosure.

The battery cell state sensing device 10 may include the image acquisition unit 300, a controller 400, and a notification unit 500.

The image acquisition unit 300 may acquire images and transmit a first signal S1 including the images to the controller 400.

The controller 400 may be connected to the image acquisition unit 300. The controller 400 may acquire height information from the images included in the first signal S1 and determine a state of the battery cell 200 based on the height information. The controller 400 may transmit a second signal S2 including the state of the battery cell 200 to the notification unit 500.

The notification unit 500 may be connected to the controller 400. The notification unit 500 may notify a user of the state of the battery cell 200 included in the second signal S2.

Figure 14:
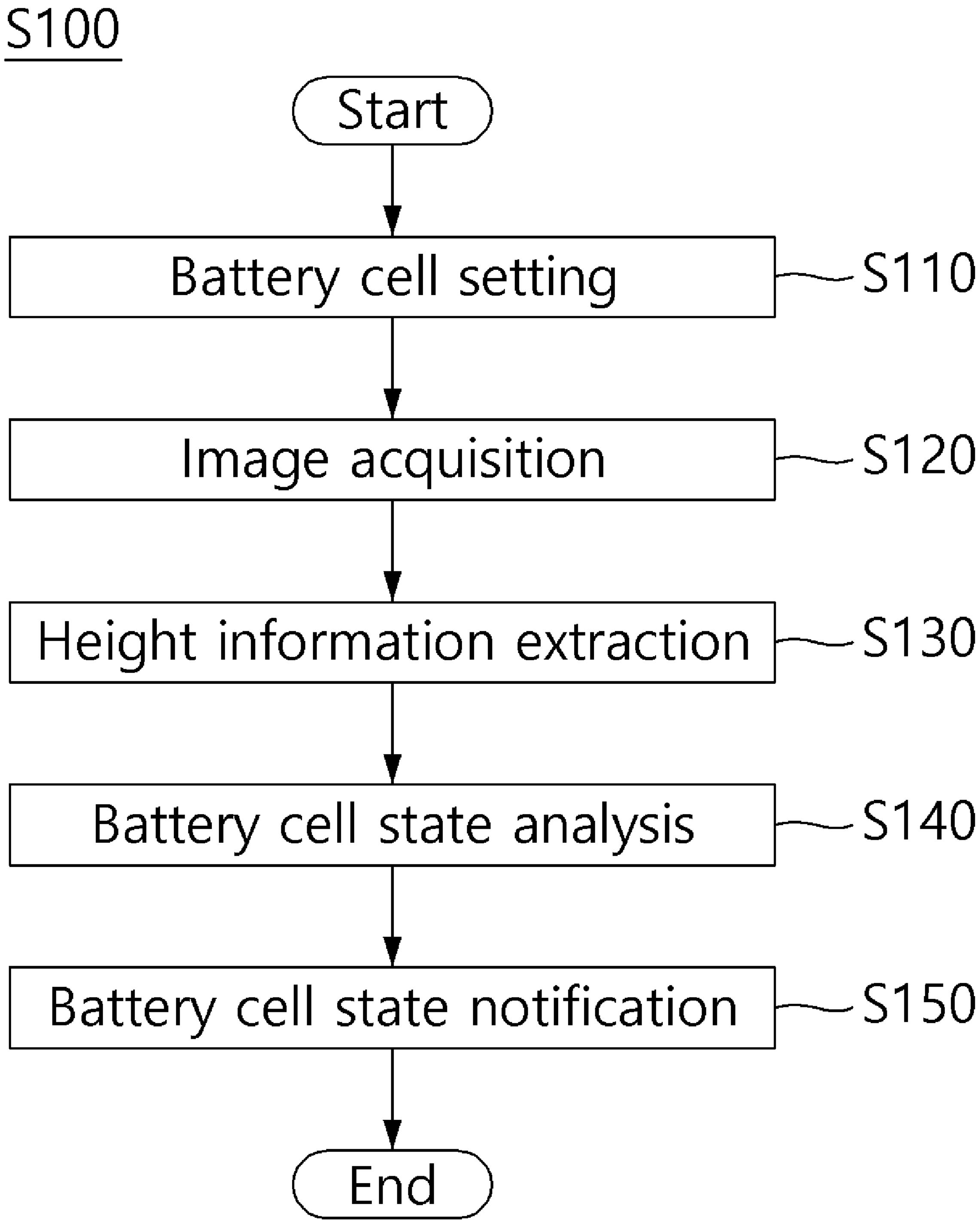
FIG. 14 is a flow chart illustrating a method S100 of sensing a state of a battery cell according to an embodiment of the present disclosure.

FIG. 14 is a flow chart illustrating a method S100 of sensing a state of a battery cell according to an embodiment of the present disclosure.

A method S100 of sensing a state of a battery cell may include a battery cell setting step S110. In the step S110, the battery cell 200 may be disposed on the mounting unit 100. The plurality of battery cells 200 may be disposed on the mounting unit 100.

The method S100 may include an image acquisition step S120. In the step S120, the image acquisition unit 300 may acquire images of the mounting unit 100 and the battery cell 200. The image acquisition unit 300 may acquire a plurality of images. In the step S120, the image acquisition unit 300 may transmit the acquired images to the controller 400.

The method S100 may include a height information extraction step S130. In the step S130, the controller 400 may extract height information from the images acquired in the previous step S120. Referring to FIG. 3, the height information may include at least one of a first height h1 which is height information of a point of the first wall upper surface 131, a second height h2 which is height information of a point of the first tab upper surface 221, a third height h3 which is height information of the base upper surface 112, a fourth height h4 which is height information of a point of the second wall upper surface 141, and a fifth height h5 which is height information of a point of the second tab upper surface 231.

The method S100 may include a battery cell state analysis step S140. In the step S140, the controller 400 may compare the height information extracted in the previous step S130 to analyze the state of the battery cell 200. The controller 400 may determine that the state of the battery cell 200 is the normal state ST1 or the abnormal state ST2.

The method S100 may include a battery cell state notification step S150. In the step S150, the notification unit 500 may receive a state of the battery cell 200 from the controller 400 and notify the user of the state. The notification unit 500 may notify that the state of the battery cell 200 is the normal state ST1 or the abnormal state ST2.

Figure 15:
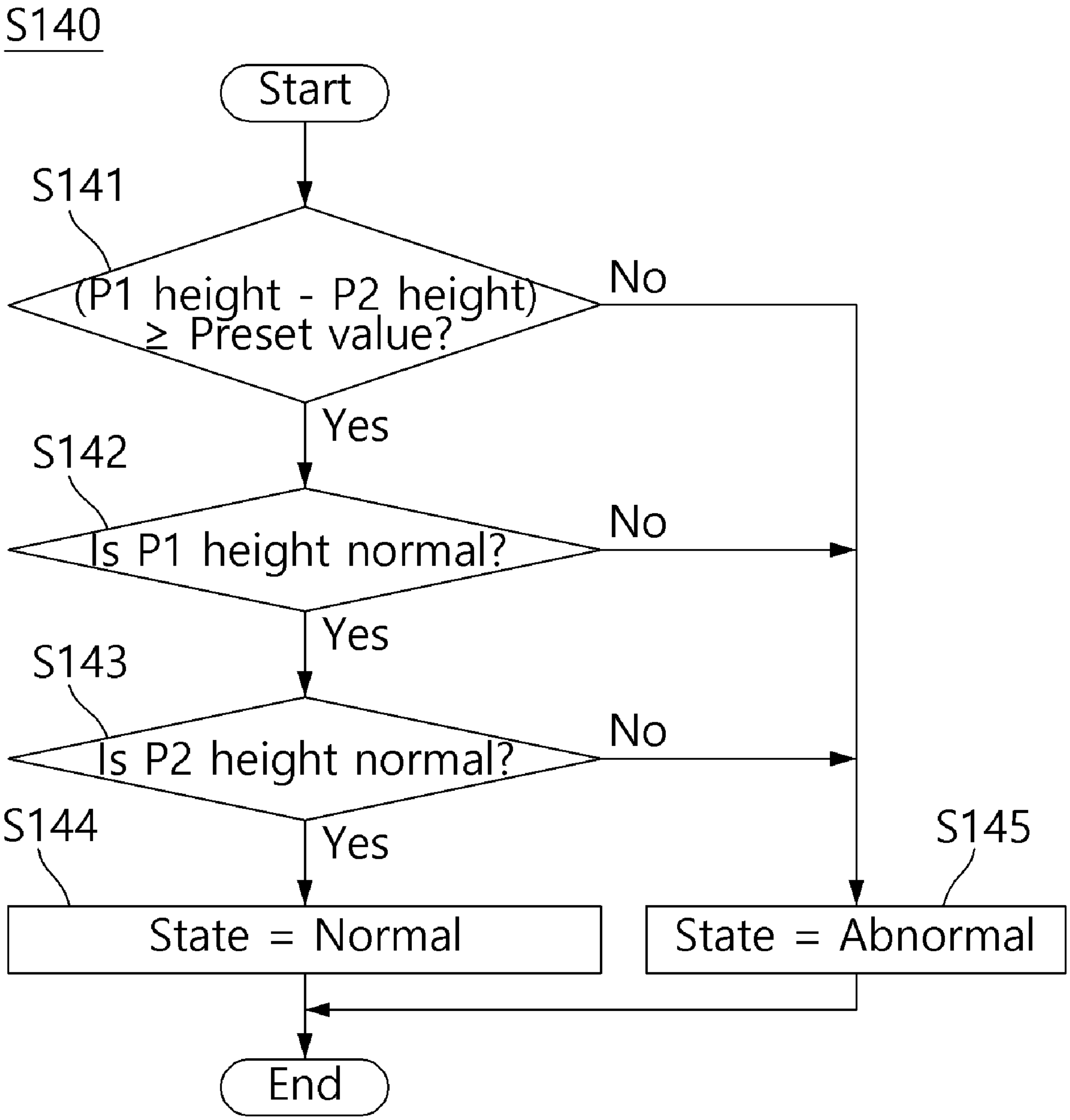
FIG. 15 is a flow chart illustrating a battery cell state analysis step S140 according to an embodiment of the present disclosure.

FIG. 15 is a flow chart illustrating a battery cell state analysis step S140 according to an embodiment of the present disclosure. The battery cell state analysis step S140 is described below with reference to FIGS. 4 to 9.

The battery cell state analysis step S140 may include a first analysis step S141. The step S141 may be a step of determining whether the tabs 220 and 230 are lifted.

For example, the step S141 may be a step of determining whether the third height difference d3 obtained by subtracting the second point height h_P2 from the first point height h_P1 is greater than or equal to the preset value d0. When the third height difference d3 is greater than or equal to the preset value d0, a second analysis step S142 may be performed. When the third height difference d3 is less than the preset value d0, a second state input step S145 may be performed.

Alternatively, for example, the step S141 may be a step of determining whether the fourth height difference d4 obtained by subtracting the third point height h_P3 from the fourth point height h_P4 is greater than or equal to the preset value d0. The first analysis step S141 for the fourth height difference d4 may be performed in the same manner as the first analysis step S141 for the third height difference d3.

The battery cell state analysis step S140 may include the second analysis step S142. The step S142 may be a step of determining whether the battery cell 200 spans the wall 120 of the mounting unit 100.

For example, the step S142 may be a step of determining whether a height of the first point P1 is in the normal state ST1. For example, the step S142 may be a step of determining whether the first point P1 is positioned on the first wall 130 of the mounting unit 100.

For example, the step S142 may be a step of determining whether the fifth height difference d5 obtained by subtracting the fourth point height h_P4 from the first point height h_P1 falls within a predetermined range. The predetermined range may include a manufacturing error range between the first wall 130 and the second wall 140.

When the fifth height difference d5 falls within the predetermined range, a third analysis step S143 may be performed. When the fifth height difference d5 is out of the predetermined range, the second state input step S145 may be performed.

Alternatively, for example, the step S142 may be a step of determining whether a height of the fourth point P4 is in the normal state ST1. For example, the step S142 may be a step of determining whether the fourth point P4 is positioned on the second wall 140 of the mounting unit 100. For example, the step S142 may be a step of determining whether a sixth height difference (not shown) obtained by subtracting the first point height h_P1 from the fourth point height h_P4 falls within the predetermined range. The second analysis step S142 for the sixth height difference may be performed in the same manner as the second analysis step S142 for the fifth height difference d5.

The battery cell state analysis step S140 may include the third analysis step S143. The step S143 may be a step of determining whether may be a step of determining whether the battery cell 200 is detected. The step S143 may be a step of determining whether the tabs 220 and 230 sag.

For example, the step S143 may be a step of determining whether the second point height h_P2 is in the normal state ST1. For example, the step S143 may be a step of determining whether the second point P2 is positioned on the battery cell 200. For example, the step S143 may be a step of determining whether the second point P2 is positioned on the base 110.

For example, the step S143 may be a step of determining whether the third height difference d3 falls within the preset range, in order to determine whether the second point height h_P2 is in the normal state ST1. For example, when the third height difference d3 is less than or equal to the maximum value of the preset range, a first state input step S144 may be performed. For example, when the third height difference d3 exceeds the maximum value of the preset range, the second state input step S145 may be performed.

Alternatively, for example, the step S143 may be a step of determining whether a height of the third point P3 is in the normal state ST1. For example, the step S143 may be a step of determining whether the third point P3 is positioned on the battery cell 200. For example, the step S143 may be a step of determining whether the third point P3 is positioned on the base 110.

For example, the step S143 may be a step of determining whether the fourth height difference d4 obtained by subtracting the height of the third point P3 from the height of the fourth point P4 falls within the preset range. The third analysis step S143 for the fourth height difference d4 may be performed in the same manner as the third analysis step S143 for the third height difference d3.

The battery cell state analysis step S140 may include the first state input step S144. In the step S144, the controller 400 may input the state of the battery cell 200 as the normal state ST1 and end the battery cell state analysis step S140.

The battery cell state analysis step S140 may include the second state input step S145. In the step S45, the controller 400 may input the state of the battery cell 200 as the abnormal state ST2 and end the battery cell state analysis step S140.

When the first analysis step S141 proceeds to the second state input step S145, it may be determined that the taps 220 and 230 are lifted from the base 110. Alternatively, it may be determined that a portion of the battery cell 200 spans the wall 120. For example, it may be the state of the battery cell 200 illustrated in FIG. 6 or FIG. 8.

When the second analysis step S142 proceeds to the second state input step S145, it may be determined that the battery cell 200 spans the first wall 130. For example, it may be the state of the battery cell 200 illustrated in FIG. 9.

When the third analysis step S143 proceeds to the second state input step S145, it may be determined that the battery cell 200 is not detected at the second point P2 or the first tap 220 sags with respect to the base 110. For example, when the first height difference d1 is equal to a height difference between the first wall upper surface 131 and the base upper surface 112, it may be determined that the battery cell 200 is not detected at the second point P2. The height difference between the first wall upper surface 131 and the base upper surface 112 may be a unique value based on the shape of the mounting unit 100. For example, it may be the state of the battery cell 200 illustrated in FIG. 7. Alternatively, for example, it may be a state in which the battery cell 200 is not disposed on the mounting unit 100.

Figure 16:
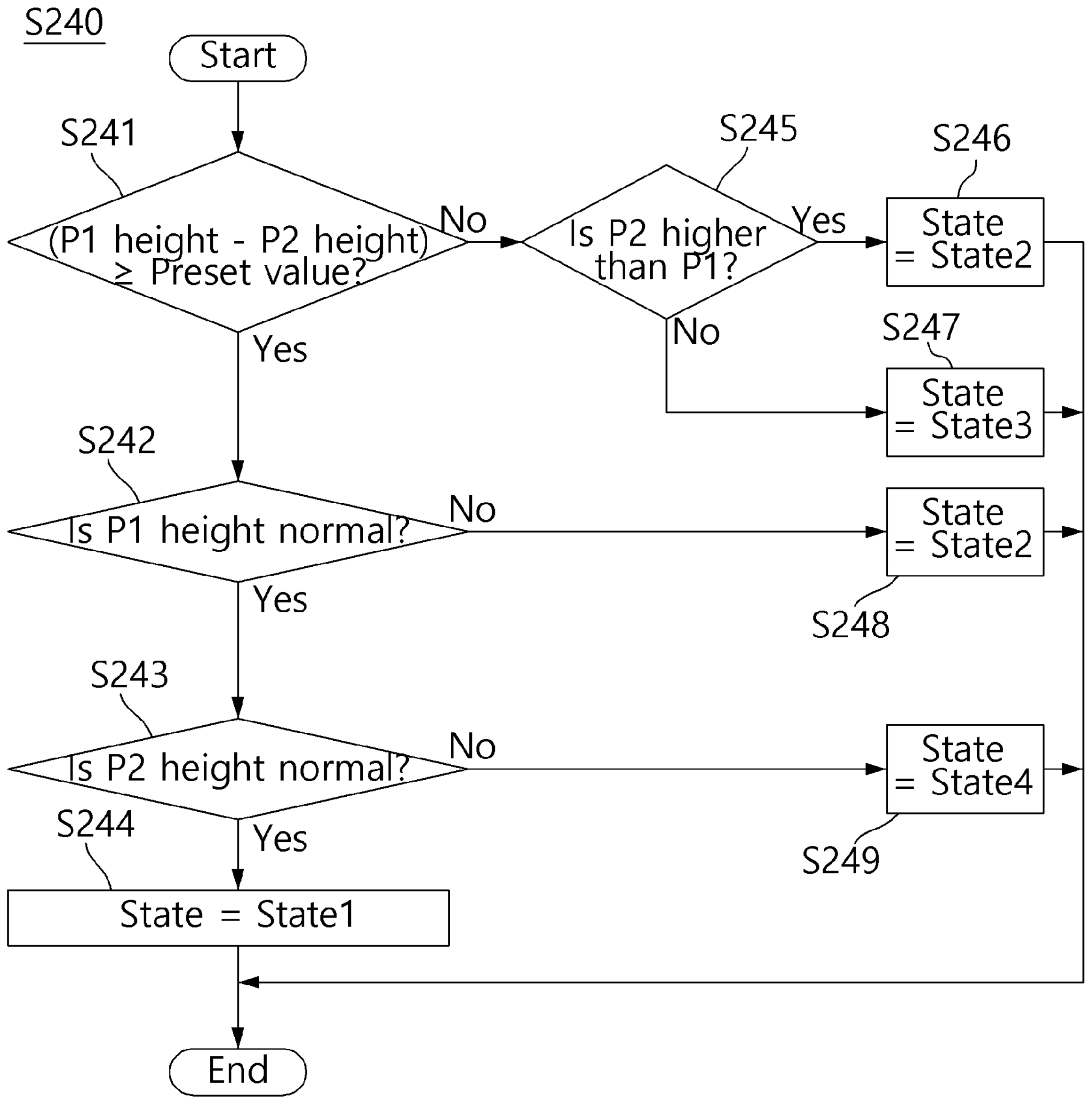
FIG. 16 is a flow chart illustrating a battery cell state analysis step S240 according to another embodiment of the present disclosure.

FIG. 16 is a flow chart illustrating a battery cell state analysis step S240 according to another embodiment of the present disclosure. The battery cell state analysis step S240 may subdivide the abnormal state ST2 of the battery cell 200, compared to the battery cell state analysis step S140 illustrated in FIG. 15.

The battery cell state analysis step S240 may include a first analysis step S241. The step S241 may be the same as the first analysis step S141 illustrated in FIG. 15. In the step S241, when the third height difference d3 obtained by subtracting a height of the second point P2 from a height of the first point P1 is greater than or equal to a preset value d0, a second analysis step S242 may be performed. In the step S241, when the third height difference d3 is less than the preset value d0, a fourth analysis step S245 may be performed.

The battery cell state analysis step S240 may include the second analysis step S242. The step S242 may be the same as the second analysis step S142 illustrated in FIG. 15. In the step S242, when a height of the first point P1 is normal, a third analysis step S243 may be performed. In the step S242, when the height of the first point P1 is abnormal, a fourth state input step S248 may be performed.

The battery cell state analysis step S240 may include the third analysis step S243. The step S243 may be the same as the third analysis step S143 illustrated in FIG. 15. In the step S243, when a height of the second point P2 is normal, a first state input step S244 may be performed. In the step S243, when the height of the second point P2 is abnormal, a fifth state input step S249 may be performed.

The battery cell state analysis step S240 may include the fourth analysis step S245. When the third height difference d3 is less than the preset value d0 in the first analysis step S241, the fourth analysis step S245 may be performed. The fourth analysis step S245 may be a step of determining whether the battery cell 200 spans the wall 120 of the mounting unit 100.

For example, the step S245 may be a step of determining whether a height of the second point P2 is in the normal state ST1. For example, the step S245 may be a step of determining whether the second point P2 is higher than the first point P1.

For example, when the third height difference d3 obtained by subtracting the second point height h_P2 from the first point height h_P1 is a negative number, a second state input step S246 may be performed. For example, when the third height difference d3 is zero or a positive number, a third state input step S247 may be performed.

The battery cell state analysis step S240 may include the first state input step S244. The step S244 may be a step of inputting the state of the battery cell 200 as state1. The state1 may indicate the normal state ST1.

The battery cell state analysis step S240 may include the second state input step S246. The step S246 may be a step of inputting the state of the battery cell 200 as state2. The state2 may indicate that a portion of the battery cell 200 spans the wall 120.

The battery cell state analysis step S240 may include the third state input step S247. The step S247 may be a step of inputting the state of the battery cell 200 as state3. The state3 may indicate that a portion of the battery cell 200 spans the wall 120 or the taps 220 and 230 are lifted from the base 110.

The battery cell state analysis step S240 may include the fourth state input step S248. The step S248 may be a step of inputting the state of the battery cell 200 as state2. The state2 may indicate that a portion of the battery cell 200 spans the wall 120.

The battery cell state analysis step S240 may include the fifth state input step S249. The step S249 may be a step of inputting the state of the battery cell 200 as state4. The state4 may indicate that the battery cell 200 is not detected or the taps 220 and 230 sag with respect to the base 110.

The battery cell state analysis step S240 may also be equally applied to the third point P3 and the fourth point P4.

Figure 17:
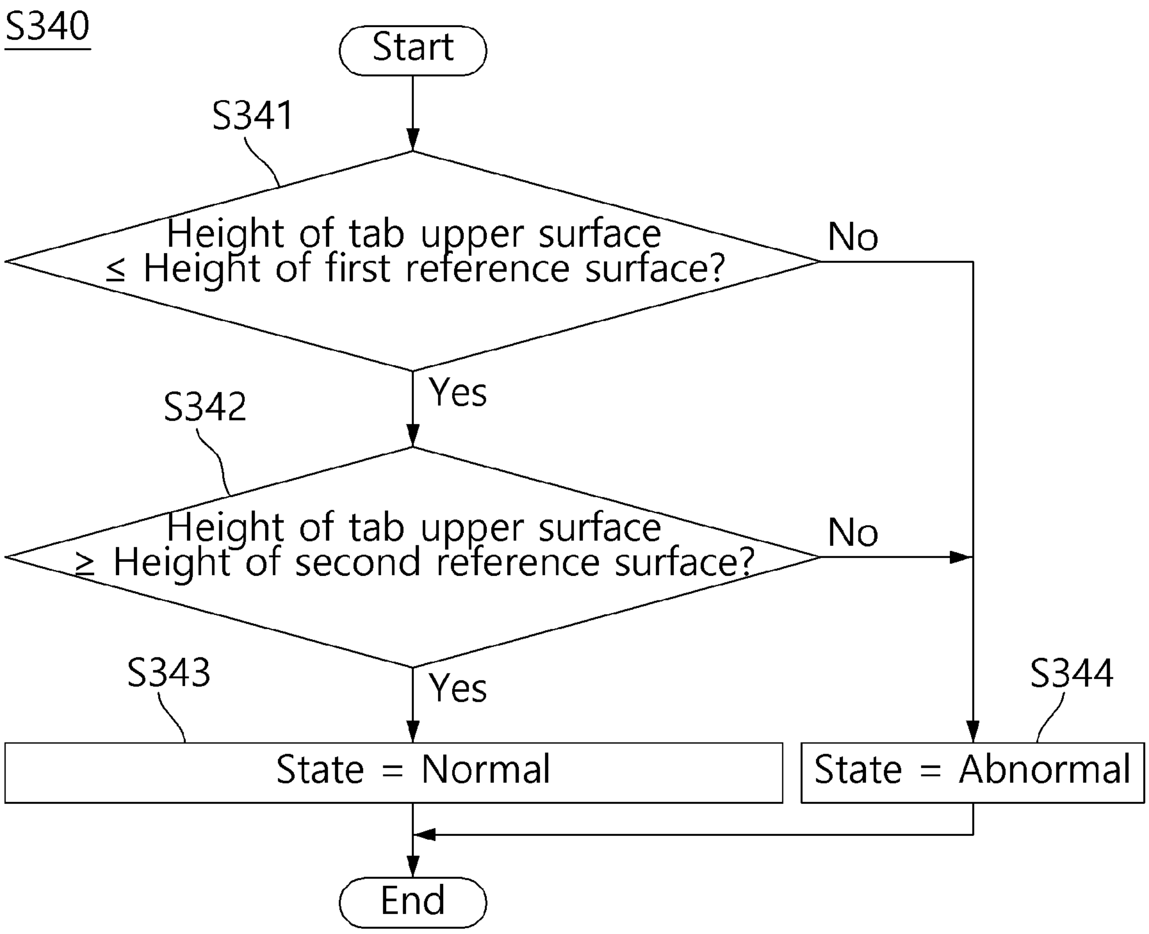
FIG. 17 is a flow chart illustrating a battery cell state analysis step S340 according to another embodiment of the present disclosure.

FIG. 17 is a flow chart illustrating a battery cell state analysis step S340 according to another embodiment of the present disclosure. The battery cell state analysis step S340 is described below with reference to FIG. 11.

The battery cell state analysis step S340 may include a first analysis step S341. The step S341 may be a step of determining whether the tabs 220 and 230 are lifted.

For example, the step S341 may be a step of determining whether a height of the first tab upper surface 221 is less than or equal to a height of a first reference surface. For example, the first reference surface may be the second upper surface 1131*b* of the first wall 1130 illustrated in FIG. 11. When the height of the first tab upper surface 221 is less than or equal to a height of the second upper surface 1131*b*, a second analysis step S342 may be performed. When the height of the first tab upper surface 221 exceeds the height of the second upper surface 1131*b*, a second state input step S344 may be performed.

For example, the step S341 may be a step of determining whether a height of the 55th point P55 that is a point of the first tab upper surface 221 is less than or equal to a height of a point of the first reference surface. The first reference surface may be the second upper surface 1131*b*, and a point of the second upper surface 1131*b* may be the 52th point P52. When the 55th point height h_P55 is less than or equal to the 52th point height h_P52, the second analysis step S342 may be performed. When the 55th point height h_P55 exceeds the 52th point height h_P52, the second state input step S344 may be performed.

Alternatively, for example, the step S341 may be a step of determining whether a height of the second tab upper surface 231 (see FIG. 2) is less than or equal to the height of the first reference surface. The first analysis step S341 for the height of the second tab upper surface 231 may be performed in the same manner as the first analysis step S341 for the height of the first tab upper surface 221.

The battery cell state analysis step S340 may include the second analysis step S342. The step S342 may be a step of determining whether the tabs 220 and 230 sag.

For example, the step S342 may be a step of determining whether the height of the first tab upper surface 221 is greater than or equal to a height of a second reference surface. For example, the second reference surface may be the third upper surface 1131*c* of the first wall 1130. When the height of the first tab upper surface 221 is greater than or equal to a height of the third upper surface 1131*c*, a first state input step S343 may be performed. When the height of the first tab upper surface 221 is less than the height of the third upper surface 1131*c*, the second state input step S344 may be performed.

For example, the step S342 may be a step of determining whether a height of the 55th point P55 that is a point of the first tab upper surface 221 is greater than or equal to a height of a point of the second reference surface. The second reference surface may be the third upper surface 1131*c*, and a point of the third upper surface 1131*c* may be the 53th point P53. When the 55th point height h_P55 is greater than or equal to the 53th point height h_P53, the first state input step S343 may be performed. When the 55th point height h_P55 is less than the 53th point height h_P53, the second state input step S344 may be performed.

Alternatively, for example, the step S342 may be a step of determining whether the height of the second tab upper surface 231 (see FIG. 2) is greater than or equal to the height of the second reference surface. The second analysis step S342 for the height of the second tab upper surface 231 may be performed in the same manner as the second analysis step S342 for the height of the first tab upper surface 221.

The battery cell state analysis step S340 may include the first state input step S343. The step S343 may be a step of inputting the state of the battery cell 200 as the normal state ST1.

The battery cell state analysis step S340 may include the second state input step S344. The step S344 may be a step of inputting the state of the battery cell 200 as the abnormal state ST2.

When the first analysis step S341 proceeds to the second state input step S344, it may be determined that the first tap 220 is lifted from the base 110.

When the second analysis step S342 proceeds to the second state input step S344, it may be determined that the first tap 220 sags with respect to the base 110.

Unlike the above description, the first reference surface of the first analysis step S341 may be, for example, the second upper surface 2131*b* of the first wall 2130 illustrated in FIG. 12. The step S341 may be a step of determining whether a height of the 65th point P65 that is a point of the first tab upper surface 221 is less than or equal to a height of the 62th point P62 that is a point of the second upper surface 2131*b*.

Unlike the above description, the second reference surface of the second analysis step S342 may be, for example, the first upper surface 2131*a* of the first wall 2130 illustrated in FIG. 12. The step S342 may be a step of determining whether the height of the 65th point P65 that is a point of the first tab upper surface 221 is greater than or equal to a height of the 61th point P61 that is a point of the first upper surface 2131*a*.

Some embodiments or other embodiments of the present disclosure described above are not mutually exclusive or distinct from each other. Configurations or functions of some embodiments or other embodiments of the present disclosure described above can be used together or combined with each other.

It is apparent to those skilled in the art that the present disclosure can be embodied in other specific forms without departing from the spirit and essential features of the present disclosure. Accordingly, the above detailed description should not be construed as limiting in all aspects and should be considered as illustrative. The scope of the present disclosure should be determined by rational interpretation of the appended claims, and all modifications within an equivalent scope of the present disclosure are included in the scope of the present disclosure.

What is claimed is:

1. A method of sensing a state of a battery cell, the method comprising:

an image acquisition step of acquiring, by an image acquisition unit on an upper part of a mounting unit on which the battery cell is disposed, an image of the mounting unit and the battery cell;

a height information extraction step of extracting, by a controller, height information of a tab included in the battery cell with respect to a point of the mounting unit from the image; and a battery cell state analysis step of determining, by the controller, a state of the battery cell based on the height information, wherein the height information is extracted from height information of an upper surface of a wall forming perimeter of the mounting unit and height information of the tab.

2. The method of claim 1, wherein the state of the battery cell includes at least one of an arrangement state of the tab with respect to the mounting unit and an arrangement state of the battery cell with respect to the mounting unit.

3. The method of claim 1, wherein the mounting unit includes:

a base having an upper surface on which the battery cell is disposed;

an inner space formed by the base and the wall, the battery cell being disposed in the inner space, wherein the wall is extended upward from the upper surface of the base along at least a portion of a perimeter of the base.

4. The method of claim 3, wherein height information of the tab is height information of an upper surface of the tab.

5. The method of claim 4, wherein the battery cell state analysis step comprises:

when a value obtained by subtracting a height of the upper surface of the tab from a height of the upper surface of the wall falls within a preset range, determining the state of the battery cell as a normal state; and when the value obtained by subtracting the height of the upper surface of the tab from the height of the upper surface of the wall is out of the preset range, determining the state of the battery cell as an abnormal state.

6. The method of claim 4, wherein when i) a coordinate on a horizontal plane of a point on the upper surface of the wall is a first coordinate, ii) a coordinate on the horizontal plane of a point adjacent to a boundary between the base and the wall in the upper surface of the base is a second coordinate, iii) a point on the first coordinate in the image is a first point, and iv) a point on the second coordinate in the image is a second point, the height information extraction step comprises extracting height information of the first point and height information of the second point from the image.

7. The method of claim 6, wherein the battery cell state analysis step comprises:

when a value obtained by subtracting a height of the second point from a height of the first point falls within a preset range, determining the state of the battery cell as a normal state; and when the value obtained by subtracting the height of the second point from the height of the first point is out of the preset range, determining the state of the battery cell as an abnormal state.

8. The method of claim 6, wherein the battery cell state analysis step comprises:

when a value obtained by subtracting a height of the second point from a height of the first point is less than a minimum value of a preset range, determining the state of the battery cell as a state in which the tab is lifted.

9. The method of claim 6, wherein the battery cell state analysis step comprises:

when a value obtained by subtracting a height of the second point from a height of the first point is a negative number, determining the state of the battery cell as a state in which a portion of the battery cell spans the wall.

10. The method of claim 4, wherein the wall includes a plurality of upper surfaces with different heights, wherein the plurality of upper surfaces include a first reference surface and a second reference surface, and wherein the height information extraction step comprises extracting height information of the first reference surface and height information of the second reference surface.

11. The method of claim 10, wherein the battery cell state analysis step comprises:

when a height of the upper surface of the tab is between a height of the first reference surface and a height of the second reference surface, determining the state of the battery cell as a normal state; and when the height of the upper surface of the tab deviates from a value between the height of the first reference surface and the height of the second reference surface, determining the state of the battery cell as an abnormal state.

12. The method of claim 3, wherein the wall includes a first wall and a second wall disposed with the battery cell interposed therebetween.

13. The method of claim 12, wherein the height information extraction step comprises extracting height information of a point on an upper surface of the first wall and height information of a point on an upper surface of the second wall, and wherein the battery cell state analysis step comprises:

when a height of the point on the upper surface of the first wall is greater than a height of the point on the upper surface of the second wall, determining the state of the battery cell as a state in which a portion of the battery cell spans the first wall.

14. A device of sensing a state of a battery cell disposed on an upper surface of a mounting unit and including a tab, the device comprising:

an image acquisition unit positioned on an upper part of the mounting unit and configured to acquire an image of the mounting unit and the battery cell; and a controller connected to the image acquisition unit and configured to extract height information of the tab with respect to a point of the mounting unit from the image, wherein the height information is extracted from height information of an upper surface of a wall forming perimeter of the mounting unit and height information of the tab.

15. The device of claim 14, wherein the image acquisition unit includes a 3D scanner, and wherein the image is a 3D image.

16. The device of claim 14, wherein the mounting unit includes:

a base having an upper surface on which the battery cell is disposed; and an inner space formed by the base and the wall, the battery cell being disposed in the inner space, wherein the wall is extended upward from the upper surface of the base along at least a portion of a perimeter of the base.

17. The device of claim 16, wherein the wall includes a first wall and a second wall disposed with the battery cell interposed therebetween, and wherein the image acquisition unit moves between an upper part of the first wall and an upper part of the second wall.

18. The device of claim 17, wherein the tab includes a first tab and a second tab respectively disposed at both ends of the battery cell, and wherein the first tab is disposed close to the first wall, and the second tab is disposed close to the second wall.

19. The device of claim 16, wherein the wall includes a plurality of upper surfaces with different heights, wherein the plurality of upper surfaces include a first reference surface and a second reference surface, and wherein the controller extracts height information of the tab with respect to the first reference surface and the second reference surface.

20. The device of claim 14, wherein the battery cell includes a plurality of battery cells, wherein the plurality of battery cells are arranged side by side on the mounting unit, and wherein the image acquisition unit moves in an arrangement direction of the plurality of battery cells.

* * * * *